United States Patent
Wen et al.

(10) Patent No.: US 7,971,118 B2
(45) Date of Patent: Jun. 28, 2011

(54) CONVERSION DEVICE, CONVERSION METHOD, PROGRAM, AND RECORDING MEDIUM

(75) Inventors: Xiaoqing Wen, Fukuoka (JP); Seiji Kajihara, Fukuoka (JP); Kohei Miyase, Fukuoka (JP); Yoshihiro Minamoto, Fukuoka (JP); Hiroshi Date, Fukuoka (JP)

(73) Assignees: Japan Science & Technology Agency, Saitama (JP); Kyushu Institute of Technology, Fukuoka (JP); System JD Co., Ltd., Fukuoka (JP)

( * ) Notice: Subject to any disclaimer, the term of this patent is extended or adjusted under 35 U.S.C. 154(b) by 327 days.

(21) Appl. No.: 12/129,746

(22) Filed: May 30, 2008

(65) Prior Publication Data

US 2008/0235543 A1 Sep. 25, 2008

Related U.S. Application Data

(63) Continuation-in-part of application No. PCT/JP2006/323862, filed on Nov. 29, 2006.

(30) Foreign Application Priority Data

Nov. 30, 2005 (JP) ................................. 2005-346613

(51) Int. Cl.
*G01R 31/28* (2006.01)
*G06F 11/00* (2006.01)
(52) U.S. Cl. ........................................ 714/738; 714/726
(58) Field of Classification Search .................. None
See application file for complete search history.

(56) References Cited

U.S. PATENT DOCUMENTS

| 5,930,149 A | * | 7/1999 | Takahashi ........................ 716/2 |
| 6,067,651 A | * | 5/2000 | Rohrbaugh et al. .......... 714/738 |
| 6,611,933 B1 | * | 8/2003 | Koenemann et al. ......... 714/726 |
| 6,751,767 B1 | | 6/2004 | Toumiya |
| 2004/0243339 A1 | | 12/2004 | Maruyama |

FOREIGN PATENT DOCUMENTS

| JP | 2001-099901 | 4/2001 |
| JP | 2004-317505 | 11/2004 |

OTHER PUBLICATIONS

Miyase, Kohei et al. "Don't-Care Identification on Speicfic bits of test patterns". 2002 IEEE International Conference on Computer Design: VLSI in Computers and Processors, 2002.*
International Search Report for PCT/JP2006/323862 dated Feb. 20, 2007.

* cited by examiner

*Primary Examiner* — Jeffrey A Gaffin
*Assistant Examiner* — Steve Nguyen
(74) *Attorney, Agent, or Firm* — Rankin, Hill & Clark LLP

(57) ABSTRACT

Provided are a conversion device and others for converting a test vector set so as to reduce a logic value difference generated before and after scan capture in outputs of scan cells included in a full scan sequential circuit. A conversion device converts a test vector set corresponding to the full scan sequential circuit. The conversion device comprises a setting unit for setting a candidate bit which can be a don't care bit and a fixed bit which cannot be the don't care bit according to predetermined constraint conditions based on an input-output relationship in the logic circuit in order to identify the don't care bit identifiable as don't care from each test vector of the test vector set, and a logic value deciding unit for deciding a logic value for the don't care bit in view of a relationship in a plurality of bit pairs in relation to a test cube including the don't care bit identified by the setting unit.

15 Claims, 17 Drawing Sheets

Fig.9

|  | $<v : \text{PPI}>$ | $<f(v): \text{PPO}>$ | allocation of logic value to don't care bit | |
|---|---|---|---|---|
|  |  |  | logic value allocated to X | difficulty level |
| type-A | X | $b_2$ | $b_2$ | low |
| type-B | $b_1$ | X | $b_1$ | intermediate |
| type-C | X | X | 0 – 0<br>1 – 1 | high |

| <$v"$: PPI> | <$f(v")$: PPO> | $X_i$ | |
|---|---|---|---|
| | | 0 - allocation indicator | 1 - allocation indicator |
| ① $X_i$ | $b_2$ | +1 if $b_2 = 0$ | +1 if $b_2 = 1$ |
| ② $b_1$ | $X_i$ | +1 if $b_1 = 0$ | +1 if $b_1 = 1$ |
| ③ $b_1$ | $\overline{X_i}$ | +1 if $b_1 = 1$ | +1 if $b_1 = 0$ |

| Circuit | # of PIs | # of POs | # of F/Fs | # of Vectors | Fault Coverage | Original Max. Trans. |
|---|---|---|---|---|---|---|
| s1238 | 14 | 14 | 18 | 125 | 94.9 | 18 |
| s1423 | 17 | 5 | 74 | 24 | 99.1 | 49 |
| s5378 | 35 | 49 | 179 | 100 | 99.1 | 102 |
| s13207 | 31 | 121 | 669 | 235 | 98.5 | 380 |
| s15850 | 14 | 87 | 597 | 97 | 96.7 | 282 |
| s35932 | 35 | 320 | 1728 | 12 | 89.8 | 1548 |
| s38417 | 28 | 106 | 1636 | 87 | 99.5 | 590 |
| s38584 | 12 | 278 | 1452 | 114 | 95.9 | 925 |

(b)

| Circuit | Unconstrained X-Identification | | Random X-Filling | Old LCP X-Filling | | |
|---|---|---|---|---|---|---|
| | X (%) | CPU (Sec.) | Max. Trans. | Max. Trans. | Red. Ratio (%) | CPU (Sec.) |
| s1238 | 55.0 | 0.1 | 14 | 9 | 50.0 | 0.0 |
| s1423 | 41.1 | 0.1 | 40 | 34 | 30.6 | 0.0 |
| s5378 | 71.0 | 1.3 | 109 | 91 | 10.8 | 0.2 |
| s13207 | 91.6 | 8.6 | 305 | 244 | 35.8 | 5.9 |
| s15850 | 76.1 | 5.3 | 262 | 173 | 38.7 | 1.8 |
| s35932 | 34.4 | 4.0 | 1532 | 1517 | 2.0 | 0.3 |
| s38417 | 73.4 | 13.8 | 600 | 323 | 45.3 | 24.7 |
| s38584 | 79.7 | 17.5 | 802 | 437 | 52.8 | 22.3 |
| Ave. | 65.3 | — | — | — | 33.2 | — |

(c)

| Circuit | Constrained X-Identification | | Random X-Filling | New LCP X-Filling | | |
|---|---|---|---|---|---|---|
| | X (%) | CPU (Sec.) | Max. Trans. | Max. Trans. | Red. Ratio (%) | CPU (Sec.) |
| s1238 | 32.6 | 0.1 | 14 | 5 | 72.2 | 0.0 |
| s1423 | 10.8 | 0.1 | 43 | 34 | 30.6 | 0.0 |
| s5378 | 25.2 | 1.2 | 108 | 70 | 31.4 | 0.5 |
| s13207 | 33.1 | 10.3 | 333 | 198 | 47.9 | 5.5 |
| s15850 | 20.2 | 5.2 | 252 | 132 | 53.2 | 1.8 |
| s35932 | 12.8 | 3.7 | 1533 | 1482 | 4.3 | 0.6 |
| s38417 | 20.3 | 15.3 | 592 | 295 | 50.0 | 5.6 |
| s38584 | 20.6 | 14.9 | 785 | 396 | 57.2 | 7.0 |
| Ave. | 21.9 | — | — | — | 43.3 | — |

CONVERSION DEVICE, CONVERSION METHOD, PROGRAM, AND RECORDING MEDIUM

CROSS-REFERENCE TO RELATED APPLICATIONS

This application is a continuation-in-part of and claims the benefit of priority of co-pending PCT application Serial No. PCT/JP2006/323862 filed on Nov. 29, 2006, which in turn claims the benefit of priority of Japanese Patent Application No. 2005-346613 filed on Nov. 30, 2005, both of which are incorporated herein by reference.

FIELD OF THE INVENTION

The present invention relates to a conversion device, a conversion method, a program and a recording medium, more particularly to a conversion device and others for converting a test vector set for a logic circuit, and the like.

BACKGROUND OF THE INVENTION

As shown in FIG. 16, a semiconductor logic circuit is shipped through three stages, which are designing, manufacturing and testing stages. In the testing stage, a test vector, wherein the logic value of each logic bit is determined as either 0 or 1, is applied to the manufactured semiconductor logic circuit, and a test response from the semiconductor logic circuit is observed and compared to an expected test response, so that it is judged if the circuit is defective or non-defective. A ratio by which the non-defective products can be obtained is called the yielding percentage, and the yielding percentage largely affects the quality, reliability and manufacturing costs of the semiconductor logic circuit.

In general, the manufactured semiconductor logic circuit is mostly a sequential circuit. The sequential circuit comprises a combinational circuit unit including one or a plurality of AND gates, one or a plurality of NAND gates, one or a plurality of OR gates, one or a plurality of NOR gates and the like, and flip-flops for memorizing internal states of the circuit. Hereupon, the combinational circuit unit comprises an external input wire (primary input:PI), a pseudo external input wire (pseudo primary input:PPI) which is an output wire of the flip-flop, an external output wire (primary output: PO), and a pseudo external output wire (pseudo primary output:PPO) which is an input wire of the flip-flop. Inputs to the combinational circuit unit include those directly supplied from the external input wire and those supplied via the pseudo external input wire. Outputs from the combinational circuit unit include those appearing on the external output wire directly and those appearing on the pseudo external output wire.

In order to test the combinational circuit unit of the sequential circuit, it is necessary to apply a required test vector from the external input wire and the pseudo external input wire of the combinational circuit unit and observe a test response from the external output wire and the pseudo external output wire of the combinational circuit unit. Bits corresponding to the external input wire and the pseudo external input wire constitute one test vector, and bits corresponding to the external output wire and the pseudo external output wire constitute one test response.

However, in general, the output wire (pseudo external input wire) and the input wire (pseudo external output wire) of the flip-flop of the sequential circuit cannot be directly accessed from outside. Therefore, there are problems in the controllability of the pseudo external input wire and the observability of the pseudo external output wire when the combinational circuit unit is tested.

A method of solving the problems described above in the controllability and observability in the test of the combinational circuit unit which is mostly adopted is the full scan design. Describing the full scan design, the flip-flops are replaced with scan flip-flops, and the scan flip-flops are used to form one or a plurality of scan chains. The operation of the scan flip-flops is controlled by a scan enable (SE) signal wire. For example, when SE=0, the operation of the scan flip-flops is the same as that of the conventional flip-flops, and output values of the scan flip-flops are updated by a value from the combinational circuit unit when a clock pulse is given thereto. When SE=1, the scan flip-flop and another scan flip-flop in the same scan chain form one shift register, and new values are shifted into the scan flip-flops from outside and current values in the scan flip-flops are shifted out therefrom when the clock pulse is given thereto. The scan flop-flops in the same scan chain conventionally share the same scan enable (SE) signal wire, however, the scan flop-flips in the different scan chains may share the same scan enable (SE) signal wire or may respectively use different ones.

The combinational circuit unit of the full scan sequential circuit is tested in such a manner that scan shift and scan capture are repeated. The scan shift is performed in shift mode wherein the scan enable (SE) signal wire is set to logic value 1. In the shift mode, one or a plurality of clock pulses is given, and one or a plurality of new values is shifted into the scan flip-flops in the scan chain from outside, and, at the same time, one or a plurality of current values in the scan flip-flops in the scan chain is shifted out therefrom. The scan capture is performed in capture mode wherein the scan enable (SE) signal wire is set to logic value 0. In the capture mode, one clock pulse is simultaneously given to all of the scan flip-flops in one scan chain, and a value of the pseudo external output wire in the combinational circuit unit is fetched into all of the scan flip-flops.

The scan shift is used in order to apply the test vector to the combinational circuit unit via the pseudo external input wire and observe the test response from the combinational circuit unit via the pseudo external output wire. Further, the scan capture is used to fetch the test response from the combinational circuit unit into the scan flip-flops. All of the test vectors are subjected to the scan shift and the scan capture so that the combinational circuit unit can be tested. Such a test method is called the scan test method.

In the scan test method, the test vector may be applied to the combinational circuit unit directly via the external input or by means of the scan shift. Because an arbitrary logic value can be set in an arbitrary scan flip-flop by the scan shift, the problem in the controllability of the pseudo external input wire can be solved. The observation of the test response from the combinational circuit unit may be performed directly via the external output or by means of the scan shift. Because the output value of the arbitrary scan flip-flop can be observed by means of the scan shift, the problem in the observability of the pseudo external output wire can be solved. As described, it is only required in the scan test method to obtain the test vector and the expected test response using an automatic test pattern generation (ATPG) program.

The scan test method described above, which is a very effective means, still includes the problem that more power is consumed in the test than in a normal operation. In the case where a CMOS circuit constitutes a semiconductor logic circuit, the power consumption includes static power consumption due to leak current and dynamic power consumption due to the switching activity of logic gates and flip-flops. Further, the latter power consumption, which is the dynamic power consumption, includes shift power consumption in a shift operation and capture power consumption in a capture operation.

A large number of clock pulses are conventionally given to one test vector at the time of the scan shift. For example, it is necessary to supply as many clock pulses as the number of the scan flip-flops at maximum in order to set new values in all of the scan flip-flops in one scan chain. Therefore, the shift power consumption is thereby increased, which may cause excessive heat generation. The excessive heat generation may lead to the breakage of the semiconductor logic circuit. Therefore, a method of reducing the shift power consumption has been actively studied.

The number of the clock pulses necessary for one test vector at the time of the scan capture is conventionally one for one scan chain. Therefore, the heat generation resulting from the scan capture power consumption does not present any problem. However, if there is a difference between the test response value and the current value of the scan flip-flop when the test response of the combinational circuit unit appearing on the pseudo external output wire is fetched into the scan flip-flop in the capture mode, the output value of the corresponding scan flip-flop changes. In the case where there is a large number of scan flip-flops which thus change the output values, a power supply voltage tentatively drops due to the switching activity of the logic gates and the scan flip-flops, which is called the IR (I: current, R: resistance) drop. The IR drop may result the malfunction of the circuit, as a result of which a wrong test value may be fetched into the scan flip-flop. Accordingly, the semiconductor logic circuit normally operable in a normal operation, may be wrongly judged to be a defective product when tested. As a result, the yielding percentage is deteriorated. In the case where the semiconductor logic circuit achieves a large scale, ultra-miniaturization and lower power supply voltage, the yielding loss induced by the false test is evident. Therefore, it is necessary to reduce the capture power consumption.

In the case where a single clock is used in the test, the scan capture power consumption can be reduced by means of the clock gating method, which, however, largely affects the physical design of the semiconductor logic circuit. In the case where a multiple clock signal is used in the test, the scan capture power consumption can be reduced by means of the one-hot method or multiple clock method. However, a test data volume is significantly increased in the first, while an enormous amount of memory consumption is necessary for the generation of the test vector in the latter, which both impose a significant burden on the ATPG. In the process of reducing the scan capture power consumption, it is desirable to lessen the influence on the physical design, the increase of the test data volume and the burden on the ATPG.

A test cube including don't care bits, that is, a logic bit which can be either the logic value 0 or the logic value 1 for achieving a predetermined object, is often generated in the process where the test vector is generated according to the ATPG program. In contrast, a test input not including the don't care bits but only includes logic bits (bits having the logic value 0 or logic value 1) is called a test vector. In the case where a test vector set not including the don't care bits is supplied, a part of the bits of a part of the test vectors can be set as the don't care bits without any change to a fault coverage of the set. In other words, the test cube can be obtained by a don't care bit specified program. The test cube is present because one or a plurality of targeted faults in the combinational circuit unit of the full scan sequential circuit can be often detected when the necessary logic values are simply set in a part of the bits in the external input wire and the pseudo external input wire. Though 0 or 1 is set in the rest of the bits, the detection of the targeted faults is not thereby influenced. Therefore, such influence-free bits are the don't care bits for the targeted faults.

The Non-Patent Documents 1 through 3 recite the technologies wherein a part of bits of a part of test vectors is changed into the don't care bits in a test vector set not including the don't care bits without any change to a fault coverage thereof.

The Non-Patent Document 1 recites the method of sequentially checking if respective bits called Bit-Striping can be the don't care bits in order to identify the don't care bit in each test vector. This method completely ignores a correlative relationship between the test vectors, and further, is disadvantageous in that a processing time is longer in proportion to the number of the bits.

The Non-Patent Document 2 recites the discrimination of the don't care bit based on the method called XID. This technology is different to that of the Non-Patent Document 1 in that, not each of the test vectors is independently processed, but all of the test vectors in the given test vector set are simultaneously processed in the XID method. More specifically, any fault which can only be detected by each test vector (essential fault) is detected. Then, the implication operation and logical justification of the ATPG the logic are applied so that values to be set necessarily for the detection of all of the essential faults are obtained. As a result, the other logic bits are set as the don't care bits. The method, wherein all of the input bits are not simulated, can achieve an improved efficiency and a higher speed in its execution time than the method proposed in the Non-Patent Document 1 described earlier. However, the relevant don't care bit method is not subjected to constraint conditions, meaning that any logic bit can be possibly set as the don't care bit.

In the Non-Patent Document 3, all of the test vectors in the given test vector set are simultaneously processed in place of each of the test vectors being independently processed in a manner similar to the technology recited in the Non-Patent Document 2 described earlier. A technical difference between the Non-Patent Documents 2 and 3 is that it is not allowed that any logic bit is set as the don't care bit, and the don't care bits are identified from only a part of the logic bits (called candidate bits). The don't care bit is not identified from any logic bit (called fixed bit) other than the candidate bits. In the Non-Patent Document 3, the don't care bit is identified under constraint conditions which are composed of the candidate bits and the fixed bits. This technology is advantageous in that a high speed can be achieved in a manner similar to that of the Non-Patent Document 2 described earlier, and the don't care bit can be efficiently identified so that a predetermined object can be achieved. Such an efficiency in achieving the object obviously relates to the positions of the don't care bits, therefore, it is important to set the constraint conditions including the candidate bits and fixed bits in compliance with the object.

The test cube including the don't care bits is, after all, an intermediate object appearing in the process of generating the test vector not including the don't care bits. Therefore, it is necessary to finally embed the logic value 0 or 1 in the don't care bits in the test cube.

When the logic value 0 or 1 is embedded, the necessary logic value (0 or 1) for achieving some object is conventionally determined for the don't care bits. The Non-Patent Document 4 recites the technology wherein the logic value is determined for the don't care bits of the test cube in order to reduce the scan capture power consumption.

It is recited in the Non-Patent Document 4 that, in the combinational circuit unit of the full scan sequential circuit, the test cube including the don't care bits obtained through various methods is subjected to the three-valued (logic value 0, logic value 1, and X representing don't care bit) simulation so that the test response with respect to the test cube is obtained. Then, bit pairs each provided with a pseudo input wire bit and a pseudo output wire bit are classified into a type-A bit pair including the don't care bit only in the pseudo input wire bit, a type-B bit pair including the don't care bit only in the pseudo output wire bit or a type-C bit par including the don't care bit in both of the pseudo input wire bit and the pseudo output wire bit. Further, these bit pairs are each processed in order. In the processing, the logic value of the corresponding pseudo output wire bit is allocated to the don't care bit of the pseudo input wire bit in the case of the type-A bit pair, the justification operation is performed so that the logic value of the corresponding pseudo input wire bit appears in the don't care bit of the pseudo output wire bit, and the logic value of the don't care bit in the test cube is determined in the case of the type-b bit pair, and the logic value is allocated to the pseudo input wire and the pseudo output wire is justified so that the same logic value (0 or 1) appears in the don't care bits in both of the pseudo input wire bit and the pseudo output wire bit so that the logic value of the don't care bit in the test cube is determined in the case of the type-C bit pair. The embedding technology recited in the Non-Patent Document 4 obviously focus on only one bit pair provided with one pseudo input wire bit and one pseudo output wire bit is regarded in determining the logic value for the don't care bits of the test cube. The logic value thus determined is not always optimal on the whole.

Non-Patent Document 1: R. Sankaralingam and N. A. Touba, "Controlling Peak Power During a Scan Testing", Proceedings of IEEE VLSI Test Symposium, pp. 153-159, 202.

Non-Patent Document 2: K. Miyase and S. Kajihara, "XID Don't Care Identification of Test Patterns for Combinational Circuits," IEEE Transactions on Computer-Aided Design, Vol. 23, pp. 321-326, 2004.

Non-Patent Document 3: K. Miyase, S. Kajihara, I. Pomeranz, and S. Reddy, "Don't Care Identification on Specific Bits of Test Patterns," Proceedings of IEEE/ACM International Conference on Computer Design, pp. 194-199, 2002.

Non-Patent Document 4: X. Wen, H. Yamashita, S. Kajihara, L.-T. Wang, K. Saluja, and K. Kinoshita, "On Low-Capture-Power Test Generation for Scan Testing," Proceedings of IEEE VLSI Test Symposium, pp. 265-270, 2005.

DISCLOSURE OF THE INVENTION

Problems to be Solved by the Invention

As described so far, in the test of the full scan sequential circuit, in the case where the test response value and the current value of the scan flip-flop are different when the test response of the combinational circuit unit appearing on the pseudo external output wire is fetched into the scan flip-flop in the capture mode, the output value of the corresponding to the scan flip-flop changes. If there are many of the scan flip-flops which thus change the outputs, the IR drop, which is the temporarily drop of the power supply voltage, is generated due to the switching activity of the logic gates and scan flip-flops. Accordingly, the malfunction occurs in the circuit, and the wrong test response value may be fetched into the scan flip-flop, which leads to such a misleading judgment in the test that the semiconductor logic circuit normally operating at normal times is determined as an inferior product. As a result, the yielding percentage is deteriorated. In the case where the semiconductor logic circuit achieves a ultra-large scale, ultra-miniaturization and lower power supply voltage, the yielding loss induced by such a false test is evident. Therefore, it is necessary to reduce the capture power consumption.

In order to prevent the foregoing problem from happening, in FIG. 17, it is important to use a test vector having a low capture power consumption and capable of minimizing the number of scan flip-flops 104 in which logic values fetched thereinto from a combinational circuit unit 102 and current logic values are different to each other. In order to generate such a test vector, it is necessary to generate a test cube including don't care bits by means of some method, and finish a final test vector in such a manner that the logic values which are optimal for the don't care bits included in the test cube are determined and embedded therein.

The test cube often appears in the process of generating the test vector according to the ATPG program. Further, in the case where a test vector set not including any don't care bit is given, a part of bits of a part of the test vectors can be changed to the don't care bits without any change to a fault coverage of the set. It is advantageous in terms of an application range to generate the test cube by identifying the don't care bits from the given test vector set particularly because a influence thereby generated on a test generation flow can be reduced.

However, the conventional technology for generating the test cube has various disadvantages. The technology recited in the Non-Patent Document 1 is disadvantageous in that its execution time is long, and the generated test cube does not always effectively contribute to the reduction of the capture power consumption. The technology recited in the Non-Patent Document 2 is favorably characterized in that its execution time for processing the entire test set is relatively short, and a larger number of don't care bits can be identified, however, the generated test cube does not always effectively contribute to the reduction of the capture power consumption. The technology recited in the Non-Patent Document 3 is favorably characterized in that such a test cube that can effectively reduce the capture power consumption can be generated when the don't care bits are identified from a part of the logic bits of the test set can be generated. However, the relevant document fails to include any recitation on how to determine the range where the don't care bits are identified under the constraints by the candidate bits and the fixed bits.

Other than the foregoing technologies, there is available technology wherein the logic value 0 or the logic value 1 is embedded in the don't care bit in the test cube in order to effectively reduce the capture power consumption. The technology recited in the Non-Patent Document 4, in particular, is more advantageous than the foregoing technologies in that, in view of not only the pseudo input wire bit but also the pseudo output wire bit, the logic value difference between the pseudo input wire bit and the pseudo output wire bit corresponding to each other is reduced. In the technology recited in the Non-Patent Document 4, however, only one bit pair having one pseudo input wire bit and one pseudo output wire bit is considered at a time when the logic value (0 or 1) is decided for the don't care bit. Therefore, the logic value thus decided cannot always be optimal on the whole.

So far were described the problems in the reduction of the capture power consumption. There are similar problems which are to be necessarily constrained in the reduction of a test data volume or the detection of defects in test data.

In order to solve the foregoing problems, a main object of the present invention is to provide a conversion device and a conversion method for converting a test vector set, for example, so that a logic value difference generated before and after the scan capture is reduced in outputs of scan cells included in a full scan sequential circuit, a program capable of making a computer execute the conversion method, and a recording medium in which the program is recorded.

Means for Solving the Problems

An invention as claimed in Claim 1 relates to a conversion device for converting a test vector set with respect to a logic circuit, comprising a setting unit for setting a candidate bit which can be a don't care bit, that is, a logic bit which can be either the logic value 0 or the logic value 1 for achieving a predetermined object, and a fixed bit which cannot be the don't care bit according to predetermined constraint conditions based on an input-output relationship in the logic circuit in order to identify the don't care bit identifiable as don't care from only a part of logic bits constituting each test vector of the test vector set, and a deciding unit for deciding a logic value necessary for achieving a predetermined object in the don't care bit in view of a relationship in a plurality of bit pairs each having an input bit and an output bit in relation to a test cube including the don't care bit identified from only the candidate bits set by the setting unit.

Accordingly, the test vector set not including any don't care bit can be set as a final test vector set. The final test vector set can achieve an original object of the test (fault coverage) and also, for example, avoid a false test, which is another object.

In an invention as claimed in Claim 2, the deciding unit recited in Claim 1 decides the logic value necessary for achieving the predetermined object for the don't care bit in view of the relationship in the plurality of bit pairs each including the input bit and the output bit in relation to a test cube including the don't care bit obtained by means of another method in place of the test cube including the don't care bit identified from only the candidate bits se by the setting unit.

An invention as claimed in Claim 3 relates to a conversion device for converting a test vector set with respect to a logic circuit, comprising a setting unit for setting a candidate bit which can be a don't care bit, that is, a logic bit which can be either the logic value 0 or the logic value 1 for achieving a predetermined object, according to predetermined constraint conditions based on an input-output relationship in the logic circuit in order to identify the don't care bit identifiable as don't care from logic bits constituting each test vector of the test vector set.

In an invention recited in Claim 4, the deciding unit recited in Claim 3 sets the candidate bit and further sets a fixed bit which cannot be the don't care bit, that is, a logic bit which can be either the logic value 0 or the logic value 1 for achieving a predetermined object, in order to identify the don't care bit identifiable as don't care from only a part of the logic bits constituting each test vector of the test vector set.

In an invention recited in Claim 5, any of the logic circuits claimed in Claims 1 through 4 is a full scan sequential circuit, wherein the constraint conditions are conditions defined so as to decrease the number of the different logic values before and after scan capture in outputs of scan cells included in the full scan sequential circuit.

Accordingly, the number of the different logic values before and after the scan capture can be effectively reduced in the outputs of the scan cells included in the full scan sequential circuit, and the scan capture power consumption is controlled. As a result, the false test can be avoided.

An invention as claimed in Claim 6 relates to a conversion device for converting a test vector set with respect to a logic circuit, comprising a deciding unit for deciding a logic value necessary for achieving a predetermined object in a don't care bit, that is, a logic bit which can be either the logic value 0 or the logic value 1 for achieving a predetermined object, in view of a relationship in a plurality of bit pairs each having an input bit and an output bit in relation to a test cube including the don't care bit identifiable as don't care from logic bits constituting each test vector of the test vector set.

In an invention recited in Claim 7, the logic circuit recited in Claim 1, 2 or 6 is a full scan sequential circuit, wherein the object is to effectively reduce the number of the different logic values before and after scan capture in outputs of scan cells included in the full scan sequential circuit.

An invention as claimed in Claim 8 relates to a conversion method for converting a test vector set with respect to a logic circuit, comprising a setting step in which a setting unit sets a candidate bit which can be a don't care bit, that is, a logic bit which can be either the logic value 0 or the logic value 1 for achieving a predetermined object, and a fixed bit which cannot be the don't care bit according to predetermined constraint conditions based on an input-output relationship in the logic circuit in order to identify the don't care bit identifiable as don't care from only a part of logic bits constituting each test vector of the test vector set, and a deciding step in which a deciding unit decides a logic value necessary for achieving a predetermined object in the don't care bit in view of a relationship in a plurality of bit pairs each having an input bit and an output bit in relation to a test cube including the don't care bit identified from only the candidate bits set by the setting unit or a test cube including the don't care bit obtained by means of another method.

An invention as claimed in Claim 9 relates to a conversion method for converting a test vector set with respect to a logic circuit, comprising a setting step in which a setting unit sets a candidate bit which can be a don't care bit, that is, a logic bit which can be either the logic value 0 or the logic value 1 for achieving a predetermined object, according to predetermined constraint conditions based on an input-output relationship in the logic circuit in order to identify the don't care bit identifiable as don't care from logic bits constituting each test vector of the test vector set.

In an invention as claimed in Claim 10, the setting unit sets the candidate bit and further sets a fixed bit which cannot be the don't care bit, that is, a logic bit which can be either the logic value 0 or the logic value 1 for achieving a predetermined object, in order to identify the don't care bit identifiable as don't care from only a part of the logic bits constituting each test vector of the test vector set in the setting step recited in Claim 9.

An invention as claimed in Claim 11 relates to the conversion method recited in Claim 8 or 10, wherein the logic circuit is a full scan sequential circuit, and the setting step includes a first step for discriminating a bit in which a logic value difference is generated before and after scan capture and a bit in which the logic value difference is not generated before and after scan capture from each other in outputs of scan cells included in the full scan sequential circuit in relation to each test vector of the test vector set, a second step for setting the bit in which the logic value difference is not generated as the fixed bit, and a third step for identifying the candidate bit satisfying the predetermined conditions among the bits in which the logic value difference is generated and setting the remaining bits in which the logic value difference is generated failing to be identified as the candidate bit as the fixed bit, and the don't care bit, that is, a logic bit which can be either the logic value 0 or the logic value 1 for achieving a predetermined object, identifiable as don't care is identified from the candidate bits, while the don't care bit is not identified from the fixed bits.

In an invention as claimed in Claim 12, the third step recited in Claim 11 includes a step of deciding a scheduled total number of the candidate bits in the each test vector, a step of allocating the don't care bit, that is, a logic bit which can be either the logic value 0 or the logic value 1 for achieving a predetermined object, to all of the bits in which the logic value difference is generated, and performing three-valued logic simulation and identifying a don't care bit pair of type 1 in which the don't care bit is present in the input bit and is not present in the output bit corresponding thereto and a don't care bit pair of type 2 in which the don't care bit is present in both of in the input bit and the output bit corresponding thereto depending on a result of the three-valued logic simulation, and a step of preferentially selecting the identified don't care bit pair of the type 1 as the candidate bit and selecting the don't care bit of the type 2 as the candidate bit based on predetermined criteria in the case where number of the don't care bits of the type 1 is zero and number of the candidate bits already selected fails to reach the scheduled total number.

In the inventions as claimed in Claims 11 and 12, for example, the invention recited in Claim 10 can be realized by means of the specific method, and the object, which is the effective reduction of the number of the different logic values before and after the scan capture in the outputs of the scan cells included in the full scan sequential circuit, can be achieved.

An invention as claimed in Claim 13 relates to a conversion method for converting a test vector set in relation to a logic circuit, comprising a deciding step for deciding a logic value necessary for achieving a predetermined object in a don't care bit, that is, a logic bit which can be either the logic value 0 or the logic value 1 for achieving a predetermined object, in view of a relationship in a plurality of bit pairs each having an input bit and an output bit in relation a test cube including the don't care bit identifiable as don't care among logic bits constituting each test vector of the test vector set.

An invention as claimed in Claim 14 relates to the conversion method recited in Claim 8 or 13, wherein the logic circuit is a full scan sequential circuit, and the deciding step includes a step of judging the don't care bits corresponding to the outputs of the scan cells included in the full scan sequential circuit to be different to each other in the test cube and checking appearances of these don't care bits and inversions thereof in inputs of the scan cells included in the full scan sequential circuit in the test cube, and a step of deciding such a logic value that can minimize the number of the different logic values before and after the scan capture for the don't care bit based on the don't care bits corresponding to the outputs of the scan cells included in the full scan sequential circuit and the appearances of the don't care bits and the inversions thereof in the inputs of the scan cells included in the full scan sequential circuit.

An invention as claimed in Claim 15 relates to a program capable of making a computer execute the conversion method recited in any of Claims 8 through 14.

An invention as claimed in Claim 16 relates to a recording medium in which the program recited in Claim 15 capable of making the computer execute the conversion method is recorded.

EFFECT OF THE INVENTION

According to the present invention, the logic value difference generated before and after the scan capture in the outputs of the scan cells included in the full scan sequential circuit in the logic circuit can be effectively reduced. Accordingly, the scan capture power consumption can be controlled, and any false test can be thereby avoided. Therefore, the deterioration of a percentage of fair products, an example of which is to evaluate a semiconductor logic circuit normally operating at normal times as a defective product in a test and discard it, can be prevented.

In the conversion device and the conversion method according to the present invention, it is unnecessary to change a test design flow of the logic circuit or increase a circuit area by adding hardware. Therefore, the conversion device and the conversion method according to the present invention are very effective for avoiding any false test at the time of the capture.

Further, in the conversion device and the conversion method according to the present invention, which do not necessarily depend on types of clocks, a test data volume is not significantly increased as in the case where the clock gating method is adopted when a single clock signal is used in the test. As a result, the test data volume can be effectively reduced.

Further, the conversion device and the conversion method according to the present invention, wherein the fault coverage of the logic circuit is not deteriorated, is capable of more effectively detecting any defect in the test data.

BRIEF DESCRIPTION OF THE DRAWINGS

FIG. 3 simply explains an example of don't care judgment, which the present invention is based on.

FIG. 9 is a table in which bit pairs including the don't care bit are classified into different types.

FIG. 12 is a drawing showing rules for determining the logic value.

FIG. 14 is a table showing an experimental result according to the present invention.

DESCRIPTION OF REFERENCE SYMBOLS 400 conversion device
402 setting unit
404 logic value deciding unit

PREFERRED EMBODIMENT OF THE INVENTION

Hereinafter, a preferred embodiment of the present invention is shown below.

Figure 1:
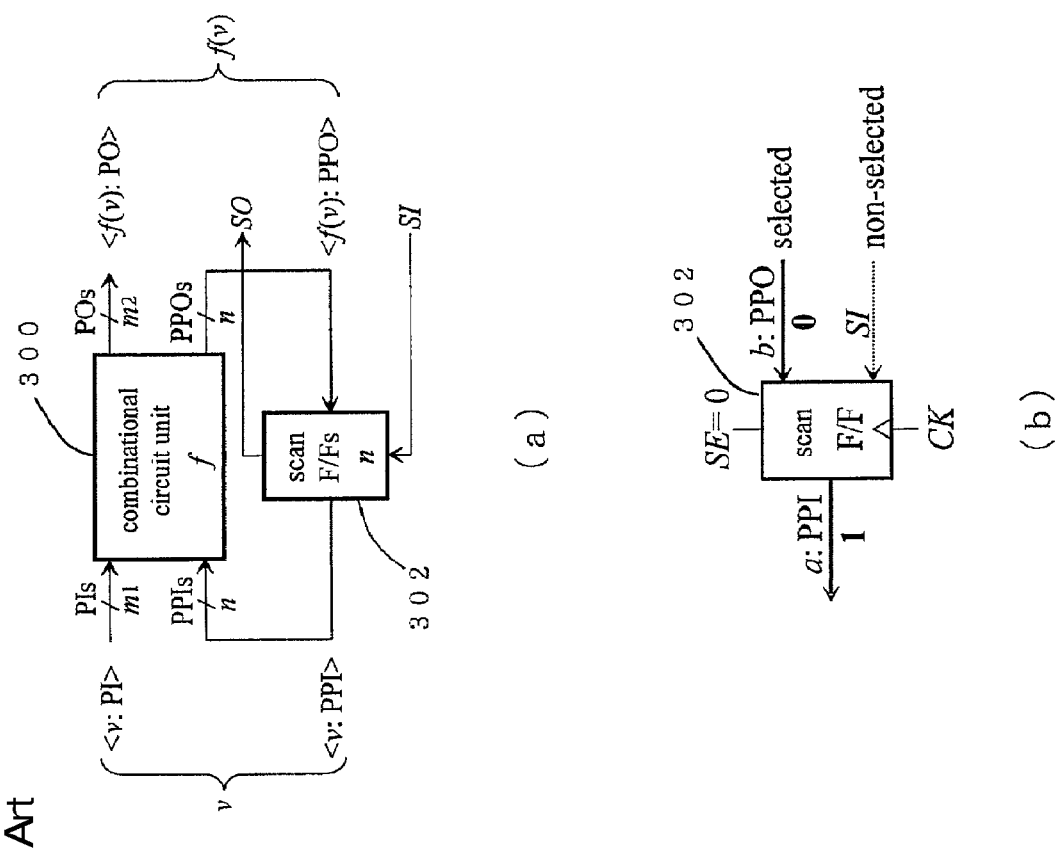
FIG. 1 is a schematic diagram illustrating a constitution of a conventional full scan circuit which is the background technology of the present invention.

Referring to FIG. 1, a conventional full scan circuit, which is the background technology of the present invention, is described.

FIG. 1a) is a schematic diagram illustrating a constitution of the conventional full scan circuit. The full scan circuit comprises a combinational circuit unit 300 and a flip-flop 302 as a full scan sequential circuit. The combinational circuit unit 300 comprises an external input wire (PI), a pseudo external input wire (PPI) which is an output wire of the scan flip-flop, an external output wire (PO), and a pseudo external output wire (PPO) which is an input wire of the flip-flop. A part supplied directly from the external input wire <v:PI> and a part supplied via the pseudo external input wire <v:PPI> constitute a test vector v for the combinational circuit unit 300. <v:PPI> is set in the scan flip-flop 302 by the scan shift. An output from the combinational circuit unit 300 is a test response f (v) corresponding to the test vector v, and a part appearing directly on the external output wire <f (v):PO> and a part appearing on the pseudo external output wire <f (v): PPO> constitute the test response f (v). <f (v): PPO> is fetched into the scan flip-flop 302 by the scan capture.

FIG. 1b) shows an example where a logic value difference is generated before and after the scan capture in the scan flip-flop 302 shown in FIG. 1a).

In FIG. 1b), when a bit a which is an element of the test vector <v:PPI> and the test response <f (v):PPO> corresponding thereto takes different logic values in the scan flip-flop 302, the logic value difference (hereinafter, referred to as transition) is generated at the time of the capture mode. The number of the transitions with respect to a test vector is deeply related to power consumption generated in an entire circuit including the combinational circuit unit 300 resulting from the relevant test vector. Therefore, when the number of the transitions at the time of the capture with respect to the test vector is reduced, the capture power consumption can be reduced.

Figure 2:
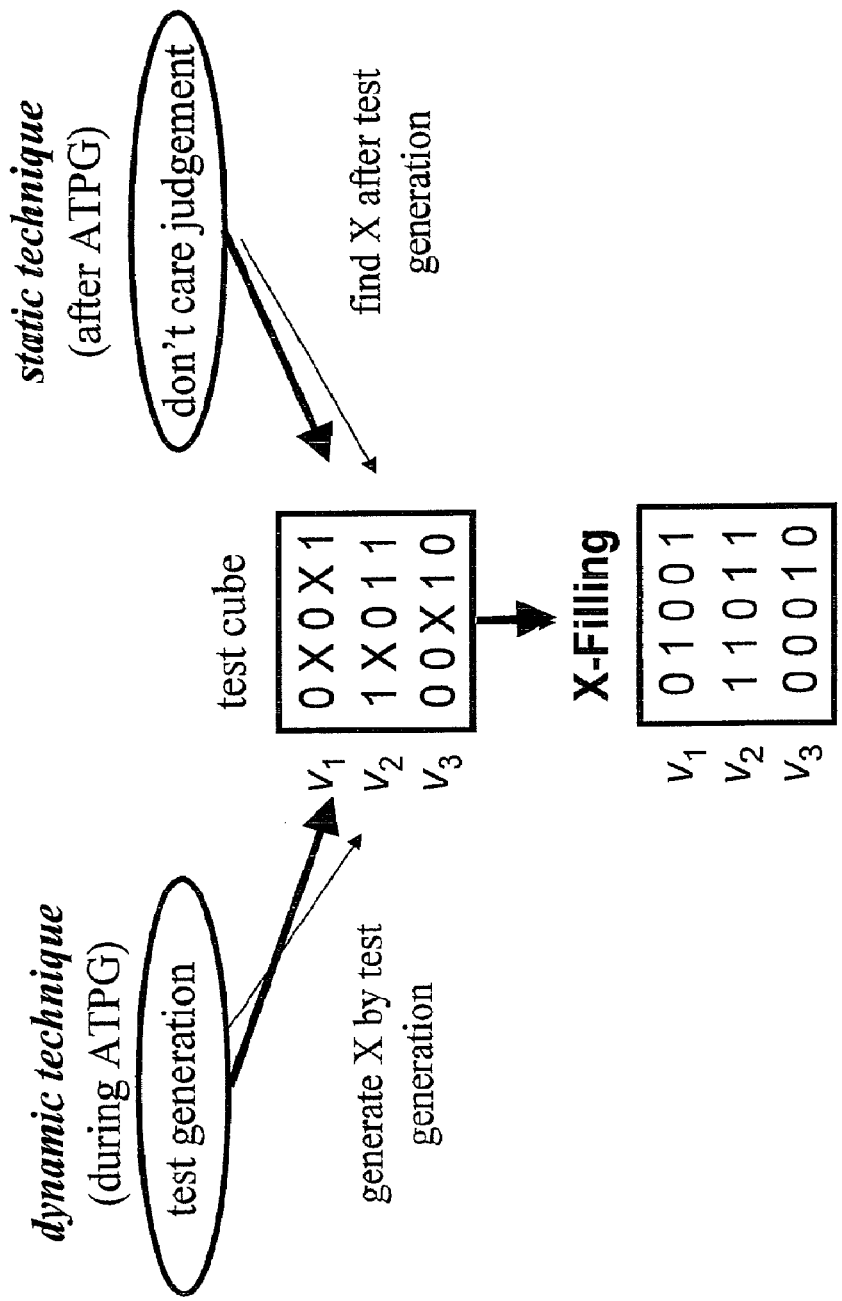
FIG. 2 explains the concept of a test cube and a test vector set, both of which the present invention is based on. Further, FIG. 2 explains an example of test data manipulation.
Figure 3:
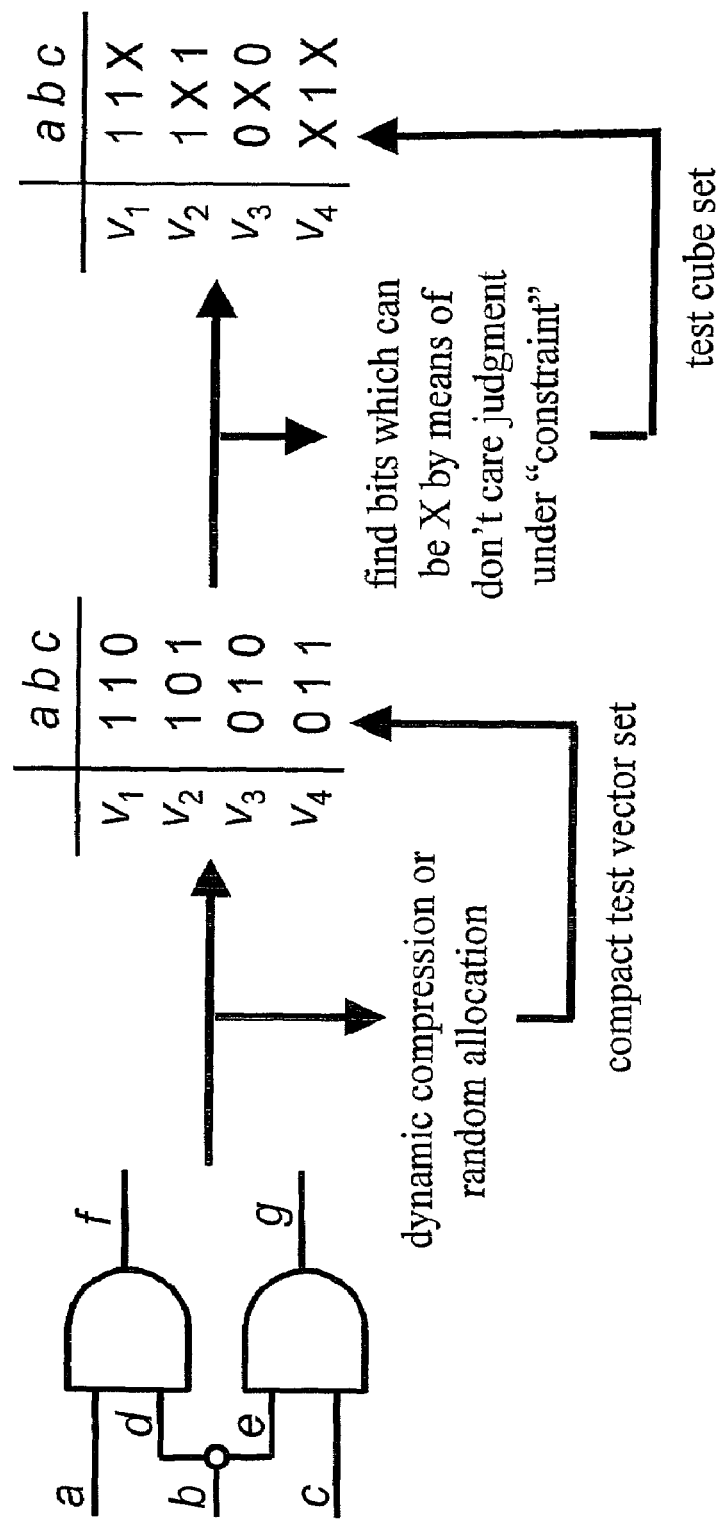

FIG. 2 explains the concept of a test cube and a test vector set, both of which the present invention is based on. Further, FIG. 2 explains an example of test data manipulation. FIG. 3 simply explains an example of don't care judgment, which the present invention is based on.

Referring to FIG. 2, a don't care bit, which can be either the logic value 0 or the logic value 1 for achieving a predetermined object such as fault detection, is shown as X. A test cube comprises v1, v2, and v3 which includes the don't care bits identifiable as don't care. A test cube can be obtained by means of a dynamic technique which generates the don't care bits during test generation by ATPG and by means of a static technique which is called don't care judgment by which the don't care bits identifiable as don't care are found after ATPG. The logic values of such test cube are determined (X-Filling), resulting in a test vector set which is composed of test vectors where the logic values are filled either with the logic value 0 or with the logic value 1. In what follows, the allocation of logic values to the don't care bits is determined so that the changes of signal values at the time of scan capture are reduced. The static technique is also applied to a compressed test vector set and the amount of test data is reduced.

Referring to FIG. 3, failure simulation, implication operation, justification manipulation are used for the judgment where the don't care bits identifiable as don't care included in a test cube are found, and the don't care bits are found under a constraint. Such a constraint is generally to adjust the failure coverage of a specific failure detection model. Usually, 60 to 90% out of the bits can be identified as don't care. On the other hand, in what follows, the constraint which doesn't change the failure coverage is possible. It is also possible that the original test vector set is given as a compact test vector set by dynamic compression or random allocation.

Figure 4:
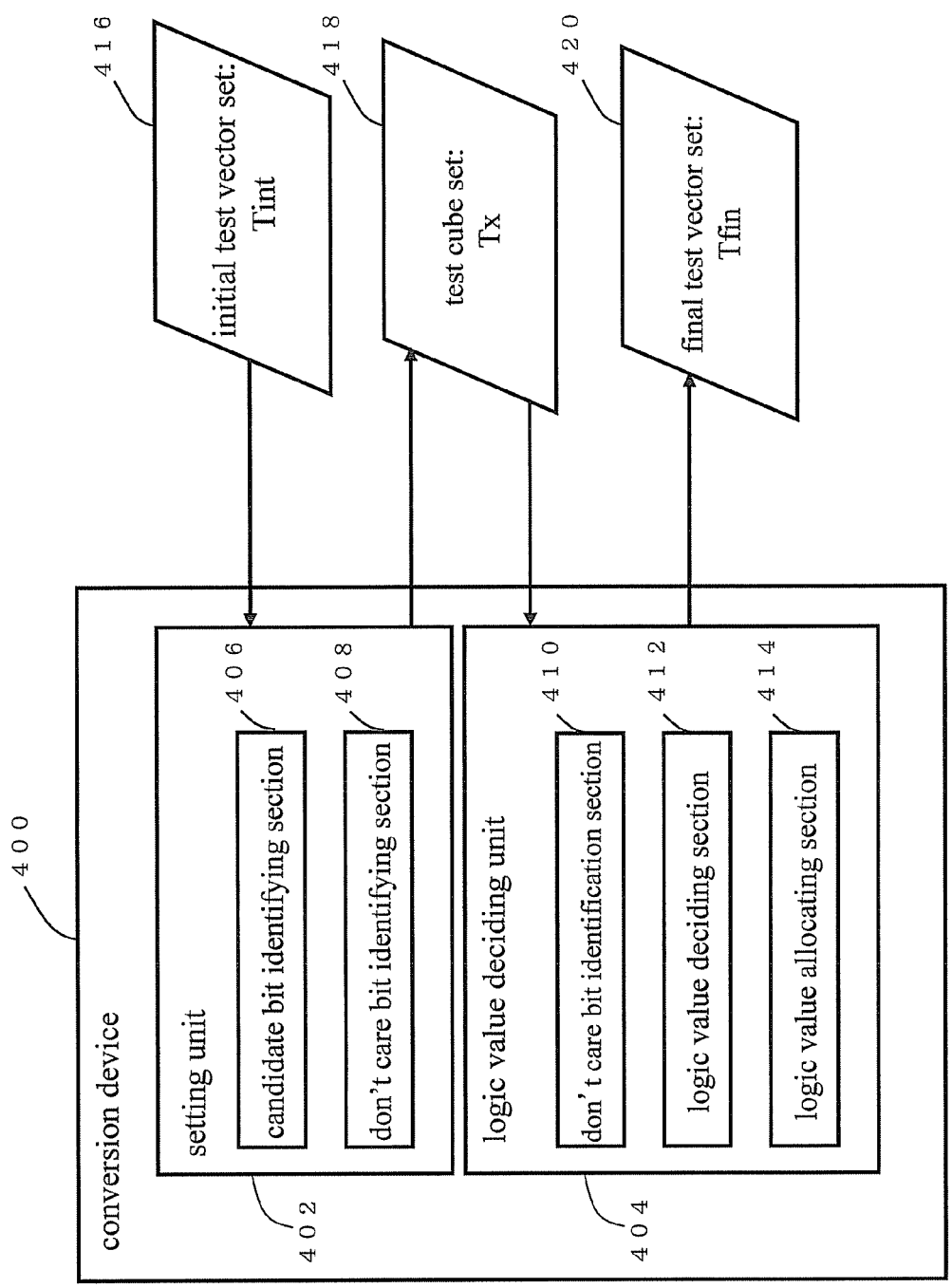
FIG. 4 is a schematic block diagram of a conversion device according to a preferred embodiment of the present invention.

Next, a constitution of a conversion device according to the preferred embodiment of the present invention is described. FIG. 4 is a schematic block diagram of the conversion device according to a preferred embodiment of the present invention.

A conversion device 400 comprises a setting unit 402 and a logic value deciding unit 404. The setting unit 402 comprises a candidate bit identifying section 406 and a don't care bit identifying section 408. The logic value deciding unit 404 comprises a don't care identification section 410, a logic value deciding section 412 and a logic value allocating section 414. As input and output data are an initial test vector set 416 (Tint), an intermediate test vector set (test cube set) 418 (Tx) and a final test vector set 420 (Tfin). The initial test vector set 416 (Tint) is a test vector set previously generated by means of the ATPG or the like. The setting unit 402 identifies a don't care bit identifiable as don't care among candidate bits based on the initial test vector set 416 (Tint), and generates the intermediate test vector set 418 (Tx). The logic value deciding unit 404 allocates a logic value to the don't care bit from the generated intermediate test vector set (Tx), and generates the final test vector set (Tfin).

Figure 5:
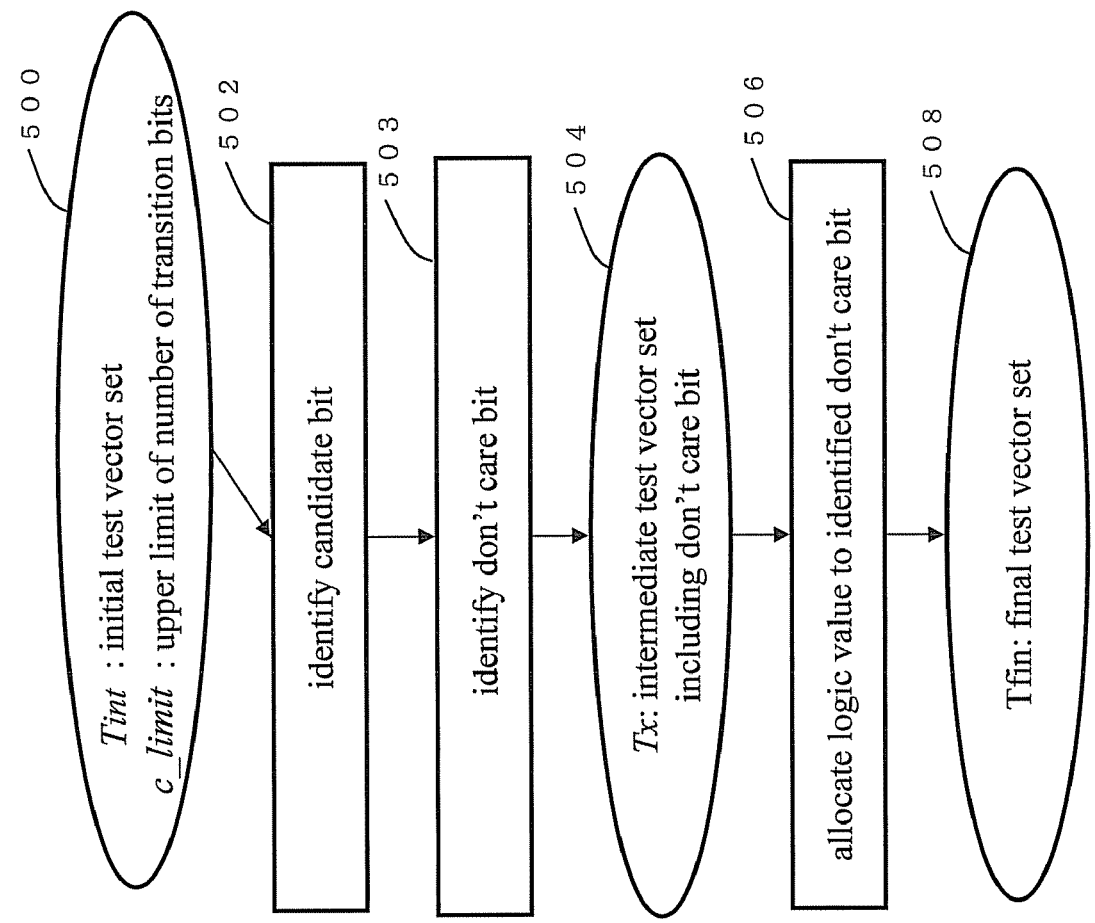
FIG. 5 shows a processing flow of the conversion device according to the preferred embodiment of the present invention.

FIG. 5 shows a processing flow of the conversion device according to the preferred embodiment of the present invention.

First, the initial test vector set 416 (Tint) shown in FIG. 4 is generated by means of the ATPG or the like and prepared in Step 500. It may be necessary to decide the logic value with respect to the don't care bit in the intermediate test cube during the generation of Tint, however, the logic value is decided at this stage in order to detect a new fault for the reduction of the number of the test vectors. Further, c_limit (upper value of the number of transition bits in each test vector) is set at the same time.

c_limit is the upper limit value of the number of the bits where the logic value difference is generated before and after the scan capture (hereinafter, referred to as transition bits) in the scan flip-flop. The number of the transition bits which is at most the upper value denotes a numeral value which can presumably avoid the generation of a false test. The number of the transition bits which is at least the upper value denotes a numeral value which possibly causes the generation of the false test. The upper limit value (c_limit) of the number of the transition bits in each test vector is determined based on the estimation of consumed electricity, empirical rule or the like in a circuit designing process. When c_limit is too large, the power consumption can hardly be effectively reduced. When c_limit is too small, effectiveness cannot be seen because there are too large a number of candidate bits, which results in the failure to identify any effective don't care bit.

Back to FIG. 5, after Tint is generated in Step 500, the candidate bit is identified by the candidate bit identifying section 406 shown in FIG. 4 in next Step 502, and the don't care bit is identified by the don't care bit identifying section 408 shown in FIG. 4 in Step 503. In Steps 502 and 503, the don't care bits showing such a distribution that effectively reduces the number of the transition bits at the time of the capture when they are identified are identified. The processings of Steps 502 and 503 are described in detail. In order to simplify the description, it is assumed that all of the scan flip-flops constitute one scan chain, the scan flip-flops are operated in a single clock domain, and the single capture method is adopted.

In the present invention, the scan flip-flops may constitute a plurality of scan chains, and the flip-flops may be operated in a plurality of clock domains. Further, the double capture method may be adopted.

There is a known method in which the justification operation and implication operation for maximizing the number of the don't care bits to be identified are utilized so that all of the test vectors are simultaneously processed. In the present preferred embodiment, the search of the don't care bits is constrained by the candidate bits, while the logic values are retained in the remaining bits as fixed bits.

Figure 6:
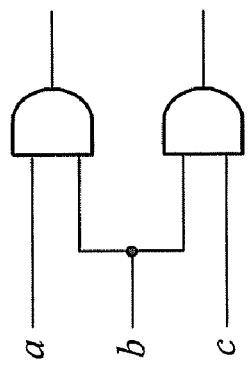
FIG. 6 is a drawing showing examples of a test vector set in which a don't care bit identifiable as don't care is identified among candidate bits.

FIG. 6 is a drawing showing examples of the test vector set in which the don't care bit identifiable as don't care is identified among the candidate bits.

FIG. 6a) is a conceptual view showing an example of a circuit which is tested by the initial test vector set. FIG. 6b) shows the initial test vector set generated in order to detect a fault hypothetically generated in the circuit. FIG. 6c) is a constraint table of the test vector set with respect to the targeted circuit. "*" denotes the candidate bit identified by the candidate bit identifying section 406 shown in FIG. 4, and "-" denotes the fixed bit not subject to value change. How the candidate bit is identified will be described later in detail. FIG. 6d) shows a result of the identified don't care bit identifiable as don't care among the candidate bits with respect to the initial test vector set. "X" shown in the drawing denotes the don't care bit identifiable as don't care among the identified candidate bits, which is identified by the don't care bit identifying section 408 shown in FIG. 4.

Next are described steps in which the candidate bit is identified and the don't care bit identifiable as don't care is identified among the candidate bits.

It is important, in identifying the don't care bit under the constraint, to generate an effective constraint table. The bit where the logic value difference is not generated before and after the scan capture in the scan flip-flop (hereinafter, referred to as non-transition bit) should be identified as the fixed bit, while the bit where the logic value difference is generated before and after the scan capture in the scan flip-flop (hereinafter, referred to as transition bit) should be identified as the candidate bit. In order to identify the candidate bit with respect to a test vector set T, the don't care bits which are guaranteed to distribute so as to effectively reduce a maximum value MCT (T) of the number of the transition bits at the time of the capture when they are identified should be identified. Below are described steps of generating the constraint table according to the present preferred embodiment.

(Step 1) An inputted test vector is subjected to the two-valued logic simulation so that the transition bit and the non-transition bit are discriminated from each other.

(Step 2) The non-transition bit in the bits discriminated in Step 1 is identified as the fixed bit.

(Step 3) A set of the transition bits is selected with respect to one test vector, and the candidate bit is identified. This process is repeatedly implemented to all of the test vectors.

(Step 4) The remaining transition bits, which were not identified as the candidate bit in Step 3, are identified as the fixed bit.

Figure 7:
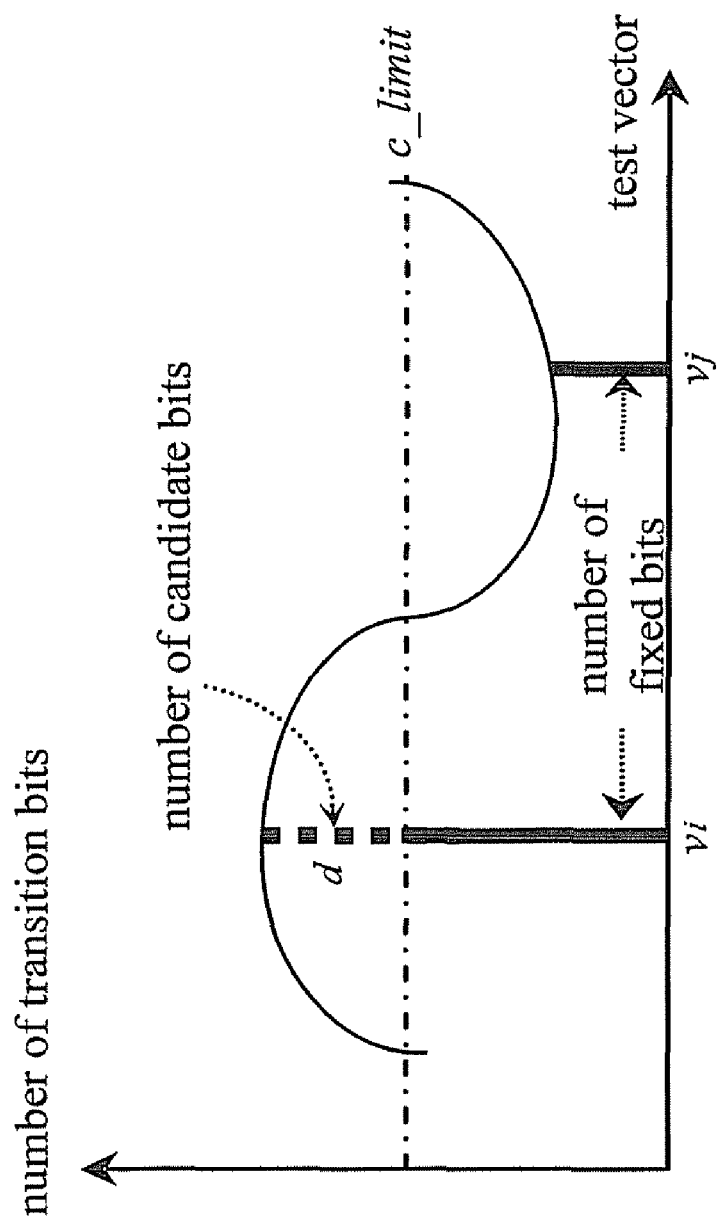
FIG. 7 is a conceptual view used for generation of a constraint table.

The constraint table according to the present preferred embodiment is described. FIG. 7 is a conceptual view used for generating the constraint table.

As shown in FIG. 7, provided that the number of the transition bits is n in the scan flip-flops with respect to a test vector and the upper limit of the number of the transition bits is c_limit, number of the candidate bits d is d=n−c_limit. The value of the number of the candidate bits d is equal to the number of bits "*" shown in FIG. 6 c).

In FIG. 7, the number of the transition bits n is larger than the upper limit c_limit of the number of the transition bits in an inputted test vector $v_i$. Therefore, a value d obtained by subtracting the upper limit c_limit of the number of the transition bits from the number of the transition bits n can be the number of the candidate bits. In $v_j$, wherein the number of the transition bits n is smaller than the upper limit c_limit of the number of the transition bits, there is not any candidate bit.

As described, the value of the number of the candidate bits d depend on how the c_limit is decided. Therefore, it is indispensable to set c_limit in an appropriate manner in order to effectively realize the present invention.

According to the concept shown in FIG. 7, it can be avoided to inefficiently identify the don't care bit and unnecessarily identify the don't care bit due to a large number of candidate bits present in one test vector. Therefore, the don't care bit can be effectively identified in any other test vector. As a result, the number of the transition bits at the time of the capture can be reduced with respect to the entire test vector set.

After the number of the candidate bits is calculated in FIG. 7, it is necessary to determine which of the bits is identified as the candidate bit.

FIG. 6 shows a method of identifying the candidate bits.

Figure 8:
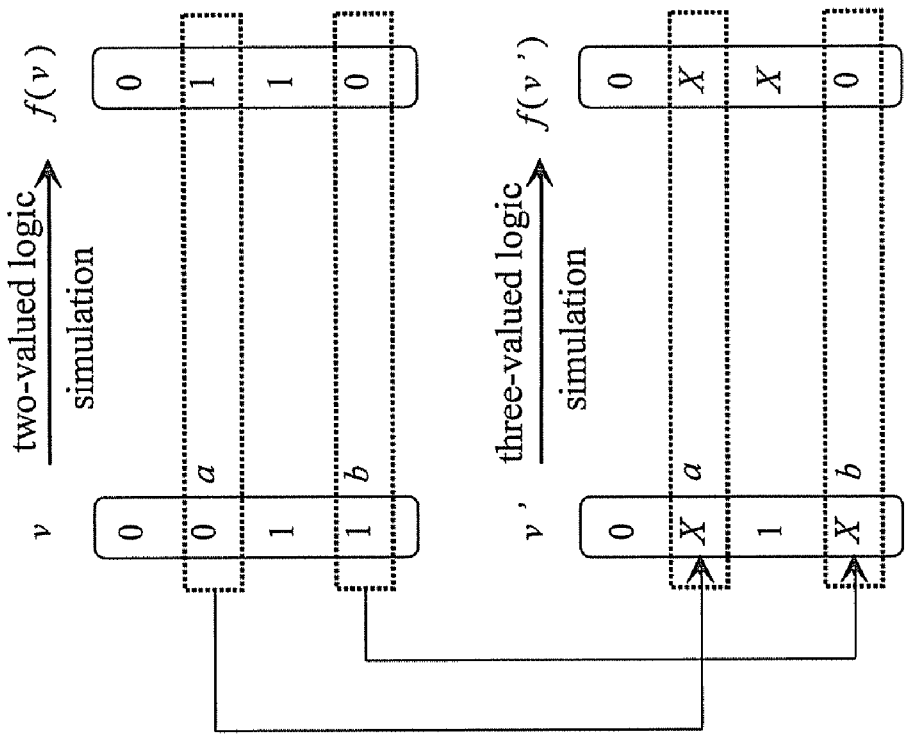
FIG. 8 is a drawing showing a method of identifying the candidate bit.

The method of identifying the candidate bits shown in FIG. 8 is a method of identifying the candidate bits in order to facilitate the allocation of the logic value to the don't care bit which is implemented later. It is assumed that a result obtained by the implementation of the two-valued logic simulation to the inputted test vector v is f (v). f (v) includes two transition bits, and the transition bits are respectively called a and b. Provided that the value of c_limit is set to 1, the number of the identified candidate bits is 1 obtained when 1 of c_limit is subtracted from the number of the transition bits which is 2.

Next, it is assumed that v' is made by replacing all the transitional bits of v with X. v' is subjected to the three-valued simulation in which three-values, 0, 1 and X, are used, and a result thereby obtained is f (v'). Then, there are two don't care bit pairs corresponding to a and b. The respective don't care bit pairs are described referring to FIG. 7.

FIG. 9 is a table in which the bit pairs including the don't care bits are classified by types.

In type A shown in FIG. 9, an input value shows the don't care bit, while an output value corresponding thereto is a fixed value. In the type A, wherein the output value is fixed, the logic value can be easily allocated to the don't care bit. In type B, an input value is a fixed value, while an output value corresponding thereto shows the don't care bit. In the case of the type B wherein the output value shows the don't care bit, it is necessary to discriminate the input value affecting the output value when the logic value is allocated to the don't care bit on the output side and then allocate the logic value to the don't care bit on the input side. It is not easy to allocate the logic value to the don't care bit in the type B in comparison to the type A. In type C, wherein both of input and output values show the don't care bit, the processings of the types A and B become necessary, which is complicated.

The don't care bit pair corresponding to a shown in FIG. 8 corresponds to the type C shown in FIG. 9, while the don't care bit pair corresponding to b shown in FIG. 8 corresponds to the type A shown in FIG. 9. Referring to FIG. 9, the allocation of the logic value to the don't care bit in the don't care bit pair corresponding to the type A is less difficult than the allocation of the logic value in the don't care bit pair corresponding to the type C. Therefore, it is desirable to identify the don't care bit pair of the type corresponding to b shown in FIG. 8.

Below are shown steps of identifying the candidate bits.

(Step 1) An inputted test vector is subjected to the two-valued logic simulation in advance so that the transition bit and the non-transition bit are discriminated from each other.

(Step 2) The transition bit discriminated in Step 1 is replaced with the don't care bit, and subjected to the three-valued logic simulation so that the don't care bit is identified.

(Step 3) The transition bits corresponding to the don't care bit pair of the type A are first selected as the candidate bit so that the number of the candidate bits is met. In the case where the number of the candidate bits is not satisfied, the transition bits corresponding to the don't care bit pair of the type C are selected as the candidate bit.

In the case where there is a plurality of types C in Step 3, the don't care bit pair in which there are a large number of don't care bits on the input side reachable from the don't care bit on the output side is preferentially selected. As there are more reachable don't care bits on the input side, it is easier to allocate the logic value to the don't care bit on the output side.

As thus processed in the foregoing steps, the candidate bit can be identified, and the don't care bit identifiable as don't care can be identified among the candidate bits.

Back to the processing flow shown in FIG. 5, the don't care bits identified thus far is the intermediate test vector set (Tx) shown in Step 504.

Figure 10:
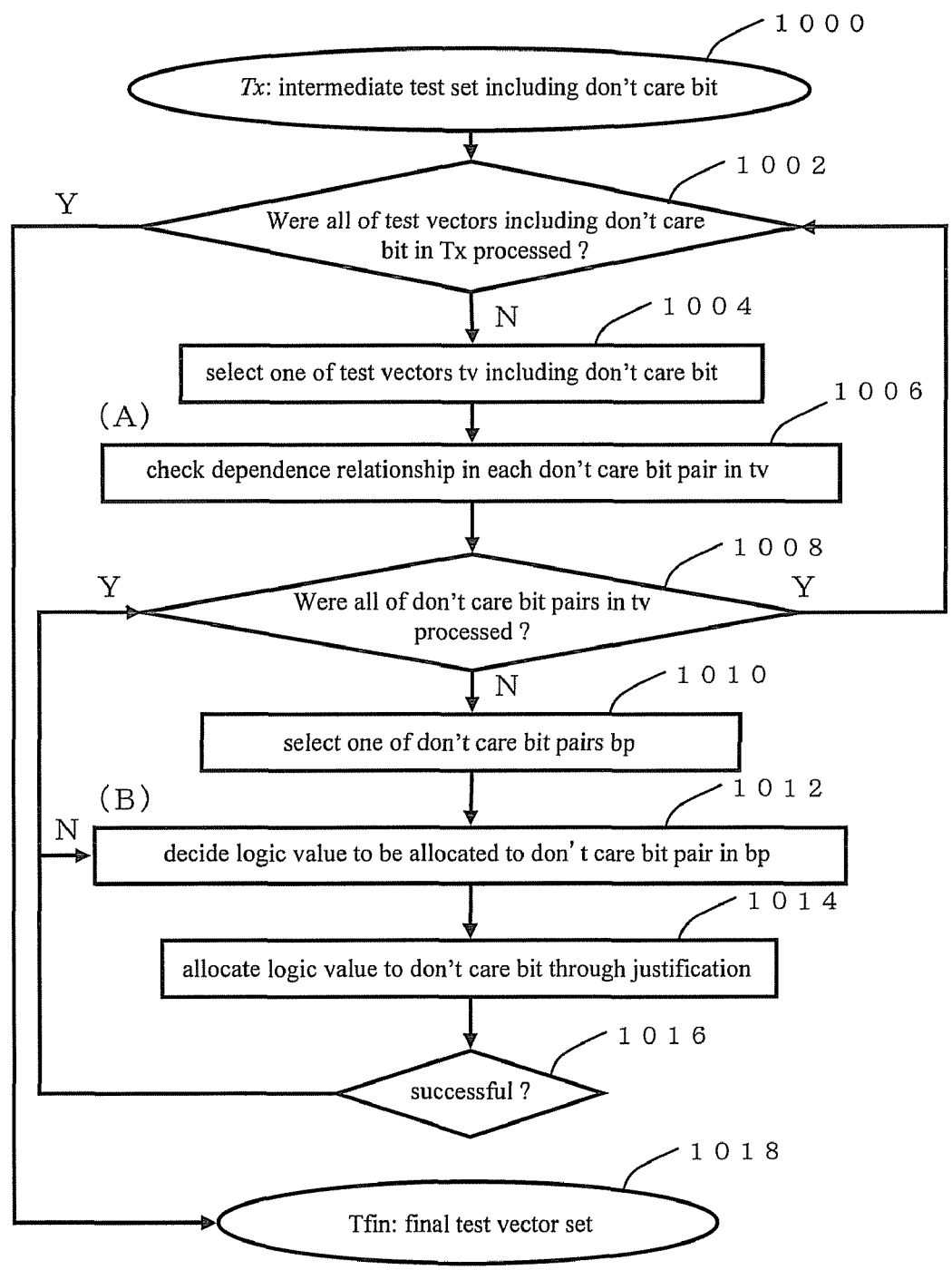
FIG. 10 is a flow chart illustrating a processing where a logic value is allocated to the identified don't care bit.

Next, the logic value deciding unit 404 shown in FIG. 4 allocates the logic value which is appropriate for the reduction of the number of the transition bits at the time of the capture to the identified don't care bits which is the intermediate test vector set 418 (Tx). FIG. 10 shows a method of the allocation. The method is similar to the conventional method in that the allocation and justification operations are implemented and they are also implemented in a combining manner so that the number of the transition bits is reduced at the time of the capture, however, the method of deciding the logic value is improved in the present preferred embodiment.

FIG. 10 is a flow chart illustrating a processing where the logic value is allocated to the identified don't care bit.

First, it is judged if all of the test vectors including the don't care bit are processed in the intermediate test vector set 418 shown in FIG. 4 (Steps 1000 and 1002). In the case where it is judged that all of the test vectors including the don't care bit were processed, the final test vector set Tfin is obtained in Step 1018, and the processing is terminated. In the case where it is judged that all of the test vectors including the don't care bit were not yet processed, the processing proceeds to Step 1004. In Step 1004, one of the test vectors including the don't care bits is selected, and a dependence relationship in each of the don't care bit pairs present in the test vector selected in Step 1004 is checked in Step 1006. The dependence relationship in each of the don't care bit pairs is checked by the don't care bit identification section 410 shown in FIG. 4.

It is judged in Step 1008 if the dependence relationship was checked in all of the don't care bit pairs. In the case where the dependence relationship was checked in all of the don't care bit pairs, the processing returns to Step 1002. In the case where the dependence relationship was not yet checked in all of the don't care bit pairs, the processing proceeds to Step 1010. One of the don't care bit pairs is selected in Step 1010, and the logic value to be allocated to the don't care bits of the selected don't care bit pair is decided in Step 1012. The processing of Step 1012 is implemented by the logic value deciding section 412 shown in FIG. 4. The logic value decided in Step 1012 is justified in Step 1014 to be allocated to the don't care bit. In Step 1016, it is judged if the allocation is successful. If not successful, the processing returns to Step 1012 to decide a new logic value. In the case where the allocation is successful, the processing returns to Step 1008 and is repeated until all of the don't care bit pairs are processed.

The justification operation in Step 1014 may not be necessary in some cases.

Below are described steps of obtaining the dependence relationship between each of all of the don't care bit pairs in the test vector including the don't care bit in Step 1006 (A) shown in FIG. 10 by partial symbolic X simulation. The dependence relationship in each of all of the don't care bit pairs refers to a relationship showing from which don't care bit on the input side the don't care bit on the output side is propagated. When the dependence relationship is checked, the logic value which is appropriate can be decided. Further, the partial symbolic X simulation is a part of the symbolic simulation conventionally used for the diagnosis of a fault.

It is assumed that the test vector including m number of don't care bits identified from the initial test vector in which all of the logic values are 0 or 1 is v'. The partial symbolic X simulation for v' is processed as follows. First, the m number of don't care bits in v' are replaced with m number of X symbols different to one another (X1, X2, . . . , Xm), which is called v". As a result, v" includes the X symbols, and the X symbols are repeatedly propagated based on the following two rules.

(Rule 1) In the case where a result of the logic operation shows NOT of Xi, it is represented with $^-$Xi ($^-$Xi shows the NOT logic).

(Rule 2) In the case where the result of the logic operation does not show a defined value, and does not show any of X symbol, Xi and $^-$Xi, a new X symbol is generated.

According to these rules, only the logic denial is stored in the propagation of the X symbols, while any information relating to other logic operations is ignored so that a memory amount to be used can be reduced while effective information is retained as long as possible at the same time.

Figure 11:
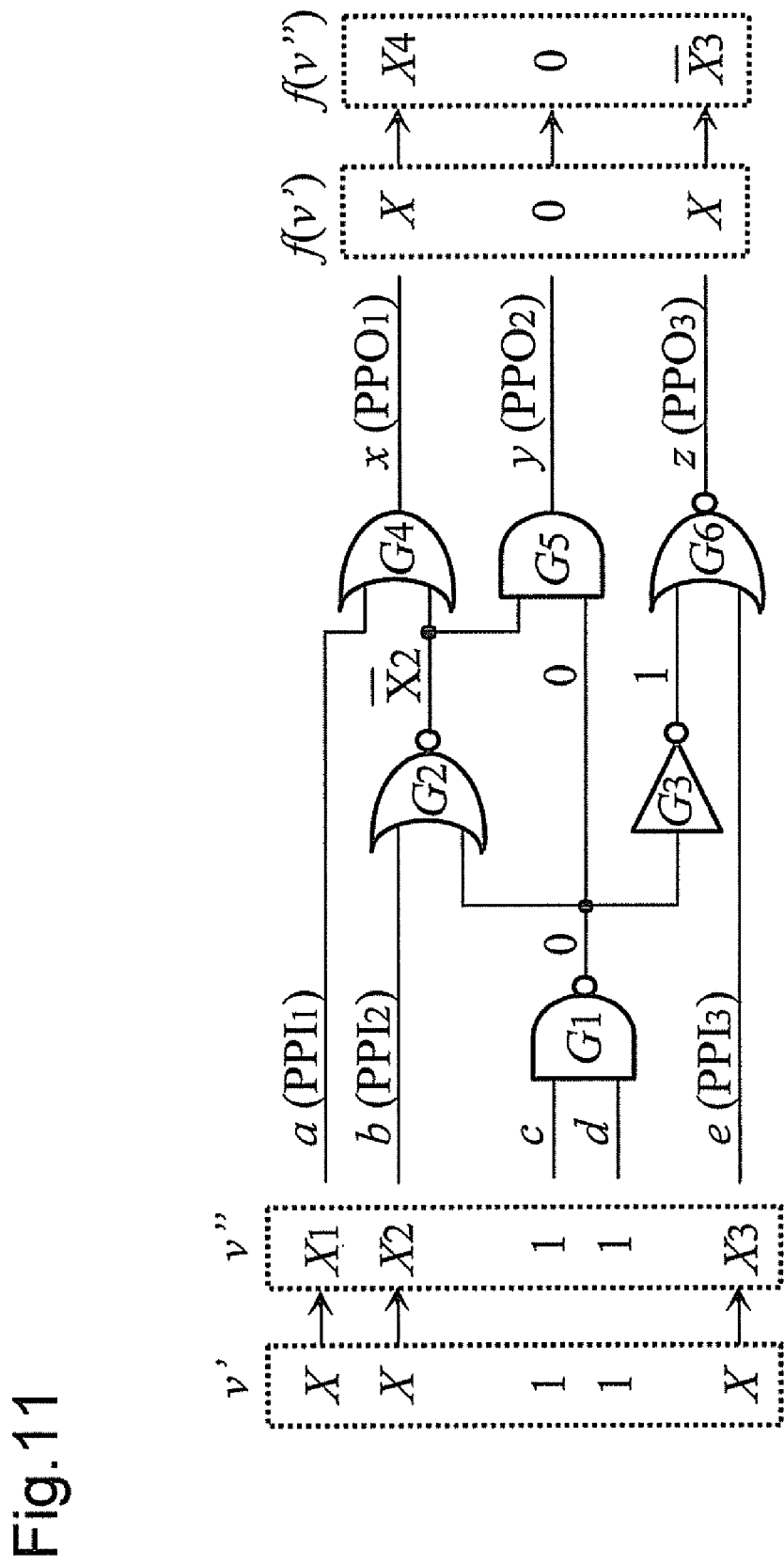
FIG. 11 shows an example of a result of the implementation of partial symbolic X simulation.

FIG. 11 shows an example of the execution of the partial symbolic X simulation.

In FIG. 11, there are three don't care bits in the inputted test vector v'. The inputted test vector in which new symbols X1, X2 and X3 are allocated to three don't care bits in v' in accordance with the mentioned rules is v". The X symbols are repeatedly propagated in accordance with the rules 1 and 2. For example, an output of a gate G2, which is NOT of X2, is represented with $^-$X2. Further, an output of a gate G4, which is OR of X1 and $^-$X2, is represented with a new symbol X4.

In general, the partial symbolic X simulation can obtain the information of the dependence relationship as shown in the example of FIG. 11 in comparison to the three-valued logic simulation. The three-valued simulation result in this description shows that the don't care bit pair on a signal wire <e, z> is <X, X>, in which the dependence relationship is not obtained. However, as a result of the partial symbolic X simulation, the don't care bit pair on the signal wire <e, z> is <X3, $^-$X3>, which shows that the same logic value cannot be obtained in the signal wire <e, z>. Such an information cannot be obtained from the three-valued logic simulation.

Next is described how the logic value to be allocated to the don't care bits of the don't care bit pair is decided and allocated in Steps 1012 (B) and 1014 shown in FIG. 10. The logic value decided therein is a value set to the don't care bit so that the number of the transition bits is reduced based on the checked dependence relationship. When the logic value which is appropriate can be decided and allocated, the number of the transition bits, which can be a factor causing the false test, can be reduced, and the false test can be thereby avoided.

It is assumed that it is necessary to allocate the logic value to the test vector v' including the don't care bits and to decide the logic value to be allocated to the don't care bits of v' and f (v'). Below are described steps of deciding the logic value.

(Step 1) v" including the X symbols corresponding to the inputted test vector v' including the don't care bits is subjected to the partial X symbolic simulation. All of the bit pairs with the X symbols can be obtained when <v":PPI> and <f (v"): PPO> are compared to each other. f (v") is a test vector on the output side of v".

(Step 2) In relation to the bit pairs with the X symbols, which are the bit pairs <Xi, b2>, <b1, Xi> and <b1, ⁻Xi>, the logic value which seems to be appropriate for Xi is calculated in accordance with a rule shown in FIG. 12. b1 and b2 shown therein are the logic values. However, an initial value of a value showing an indicator for preferentially allocating 0 to Xi and a value showing an indicator for preferentially allocating 1 thereto are 0.

(Step 3-a) When the logic value is decided for Xi in the bit pairs <Xi, b2>, <b1, Xi> and <b1, ⁻Xi>, in the case where a value showing an indicator for preferentially allocating 0 (1) is larger than a value showing an indicator for preferentially allocating 1 (0), 0 (1) is selected.

(Step 3-b) In the case where the bit pair <a, b>=<Xi, Xi>, 0 is preferentially decided, and 1 is allocated if the allocation of the decided logic value fails.

(Step 3-c) 0 is decided for a and 1 is decided for b in the case where the bit pair <a, b>=<Xi, ⁻Xi>. Then, 1 is allocated to a and 0 is allocated to b if the allocation of the decided logic values fails.

(Step 3-d) In the case where the bit pair <a, b>=<Xi, Xj> or <Xi, ⁻Xj>, the same logic value is decided for a and b. Then, the different logic values are allocated to a and b if the allocation of the decided logic value fails.

Step 1 is a processing wherein the information of the dependence relationship in the X symbol with the bit pair is obtained by the partial X symbolic simulation. Step 2 is a processing wherein the dependence relationship of the bit pair with the X symbol is taken into account. Step 3 is a processing for deciding the four different logic values. The logic value can be effectively decided for the don't care bit from results of these steps. An example where these steps are performed is described referring to FIG. 11.

Figure 13:
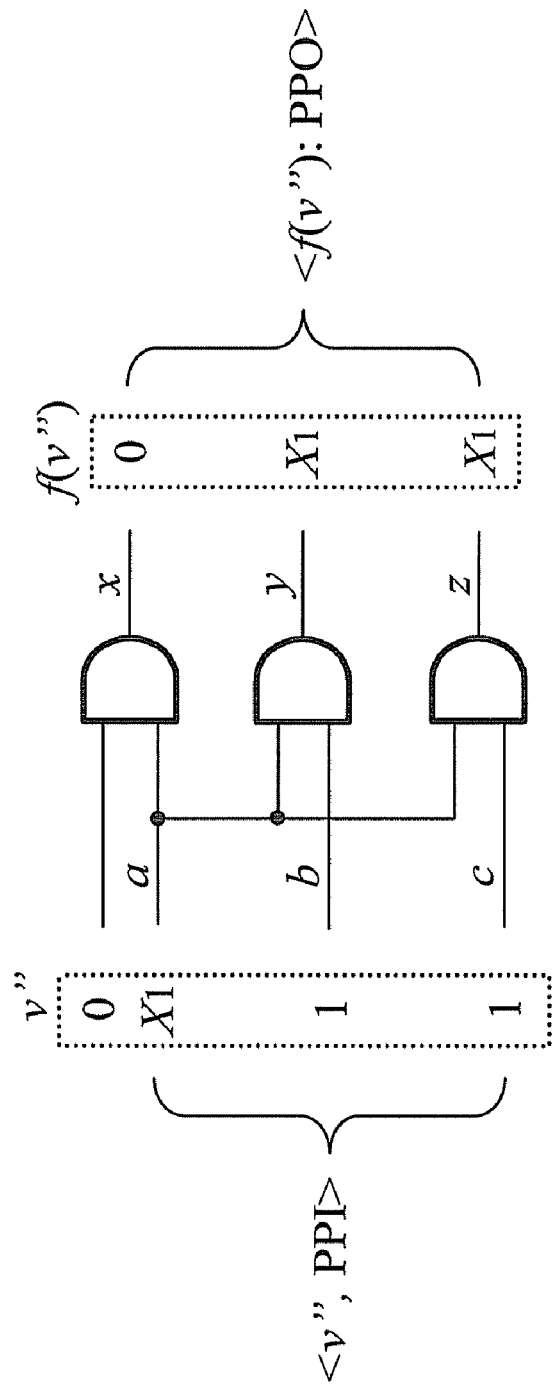
FIG. 13 is a drawing showing an example in which the logic value is determined for the don't care bit.

FIG. 13 shows an example where the logic value is decided for the don't care bit.

In FIG. 13, there are three bit pairs with the X symbols, <a, x>=<X1, 0>, <b, y>=<1, X1> and <c, z>=<1, X1>. According to the step 2, according to the table shown in FIG. 12, the value showing the indicator for preferentially allocating 0 to X1 is 1, and the value showing the indicator for preferentially allocating 1 thereto is 2. Therefore, according to the step 3-a, when the logic value for X1 in the bit pair with the X symbol <a, x>=<X1, 0> is decided, the logic value is decided as 1. This is because the transition is generated at the time of the capture in the bit pair with the X symbol <a, x>, while the transition is not generated at the time of the capture in <b, y> and <c, z>

According to the conventional method, wherein the logic value of X1 was decided only based on the relationship of <a, x> regardless of the relationship in the don't care bit pair, unlike with the case where 1 was decided as described above, 0 was decided for X1, and the effect of reducing the number of the transition bits could not be satisfactorily obtained. According to the method of deciding the logic value of the don't care bit according to the present preferred embodiment, however, the relationship in the don't care bit pair is taken into account. As a result, the number of the transition bits can be effectively reduced, and the false test can be thereby avoided.

As processed in accordance with the foregoing steps, the final test vector set (Tfin) in Step 508 shown in FIG. 5 can be obtained, and the processing is terminated.

An experimental result according to the present invention is shown below.

In the experiment, the method proposed by the present invention was installed in the C language, ISCAS'89 bench mark circuits were the target of the experiment, and calculators, which were a Pentium (registered trademark) III processor provided with the CPU 1.0 GHz and a memory of 512 MB, were used. FIG. 14 is a table showing the experimental result.

FIG. 14 a) shows basic information of the circuits used for the experiment.

The number of external inputs, external outputs and F/Fs (flip-flops) are respectively shown in "# of PIs", "# of POs" and "# of F/Fs". A test vector set for degeneracy and fault is generated by means of the ATPG program, and the number of the test vectors and fault coverage of each circuit are respectively shown in "# of Vector" and "Fault Coverage". Further, an original maximum number of the transition bits in each circuit (maximum number of the transition bits in the initial test vector set) is shown in "Original Max Trans".

FIG. 14 b) is a table showing the experimental result of the conventional method wherein the power consumption is reduced at the time of the capture in such a manner that the don't care bit is identified without the identification of the candidate bit.

A percentage of the don't care bits identified without the identification the candidate bit and a CPU time in each circuit are respectively shown in "X %" and "CPU (Sec.)" in "Unconstrained X-Identification". The bottom column shows an average value. 65.3% on average in the test vector set in which all the logic values are 0 or 1 is identified as the don't care bit without the deterioration of the fault coverage.

In the conventional LCP (Lowe Capture Power) method, the allocation of the logic value to the identified don't care bit does not take into account the dependence relationship in the don't care bit pair. A maximum number of the transition bits, a reduction percentage of the maximum number of the capture transition and CPU time in each circuit are respectively shown in "Max Trans.", "Red Rate (%)" and "CPU (Sec.)" of "Old LCP X-Filling". Further, a result in the case where the logic value is randomly allocated to the don't care bits for comparison is shown in "Max Trans." of "Random X-Filling". It is clearly known from the table shown in FIG. 14 b) by comparing "Max Trans." of "Random X-Filling" and "Max Trans." of "Old LCP X-Filling" and by taking a look at "Red Rate (%)", that the power consumption at the time of the capture can be more effectively reduced than in the conventional method where in the logic value is randomly allocated to the don't care bits.

FIG. 14c) is a table showing an experimental result according to the present preferred embodiment.

In the present preferred embodiment, the candidate bit is identified and the don't care bit identifiable as don't care is identified from the candidate bits based on the generated constraint table, and the logic value is allocated to the don't care bit so that the capture power consumption is reduced in view of the dependence relationship in the don't care bit pair. The respective columns shown in the table of FIG. 14c) are equivalent to those shown in the table of FIG. 14b).

Referring to FIG. 14b), the reduction percentage of the maximum number of the capture transition according to the conventional technology is 33.2% on average. The capture transition denotes the transition which is generated at the time of updating the output of the scan flip-flops in the capture mode (SE=1) and the capture transition is generated when the input values and the output values of the scan flip-flops are different. The test set (Test Set) is composed of a plurality of the test vectors (Test Vector) and the maximum value of the capture transition numbers is the maximum number of the capture transition. Referring to FIG. 14c), the reduction percentage of the maximum number of the capture transition according to the method of the present preferred embodiment is 43.3% on average. Accordingly, it is known that the reduction percentage of the number of the transition bits according to the method of the present preferred embodiment is improved by 30.4% in comparison to the conventional technology described above.

The number of the transition bits is deeply related to the number of transition nodes in the circuit, and the number of the transition nodes directly reflects the unnecessary capture power consumption. Therefore, the method proposed in the present invention is effective in the reduction of the unnecessary capture power consumption.

In the method according to the present preferred embodiment, it is necessary to set c_limit which is the upper limit of the number of the transition bits. In the experiment, 10% of the maximum value of the number of the transition bits in the initial test vector set Tint was set to c_limit.

The average value of "Unconstrained X-Identification" shown in FIG. 14b) shows 65.3%, and the average value of "Unconstrained X-Identification" shown in FIG. 14c) shows 21.9%. These values show that the method according to the present preferred embodiment is clearly effective in the reduction of the unnecessary capture power consumption even though the number of the don't care bits subjected to the constraint is small. It is thereby known that not only the number of the don't care bits but also the distribution of the don't care bits plays an important role in the improvement of the effect of the reduction of the unnecessary capture power consumption.

Figure 15:
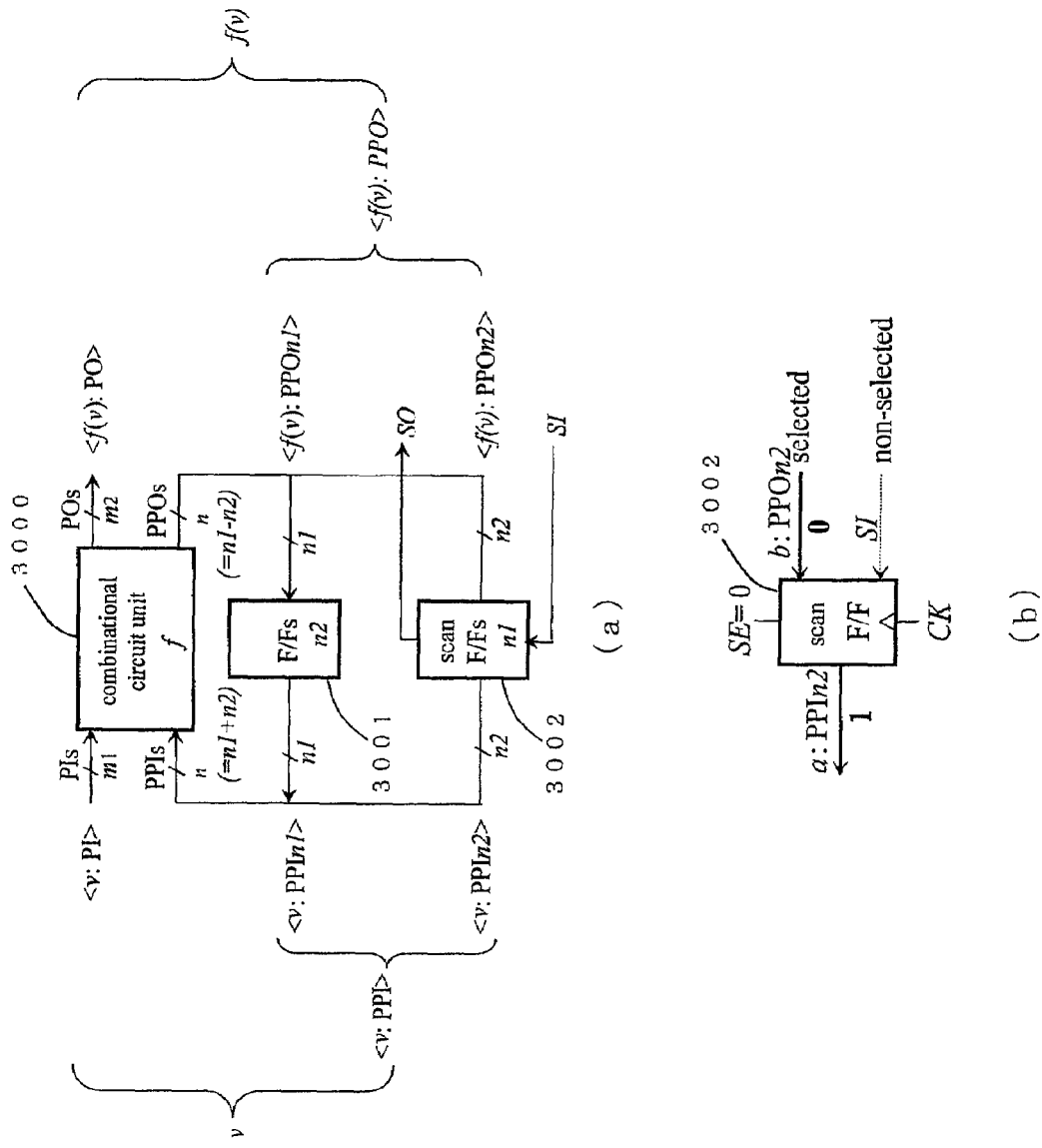
FIG. 15 is a schematic diagram illustrating a conventional partial scan circuit.
Figure 16:
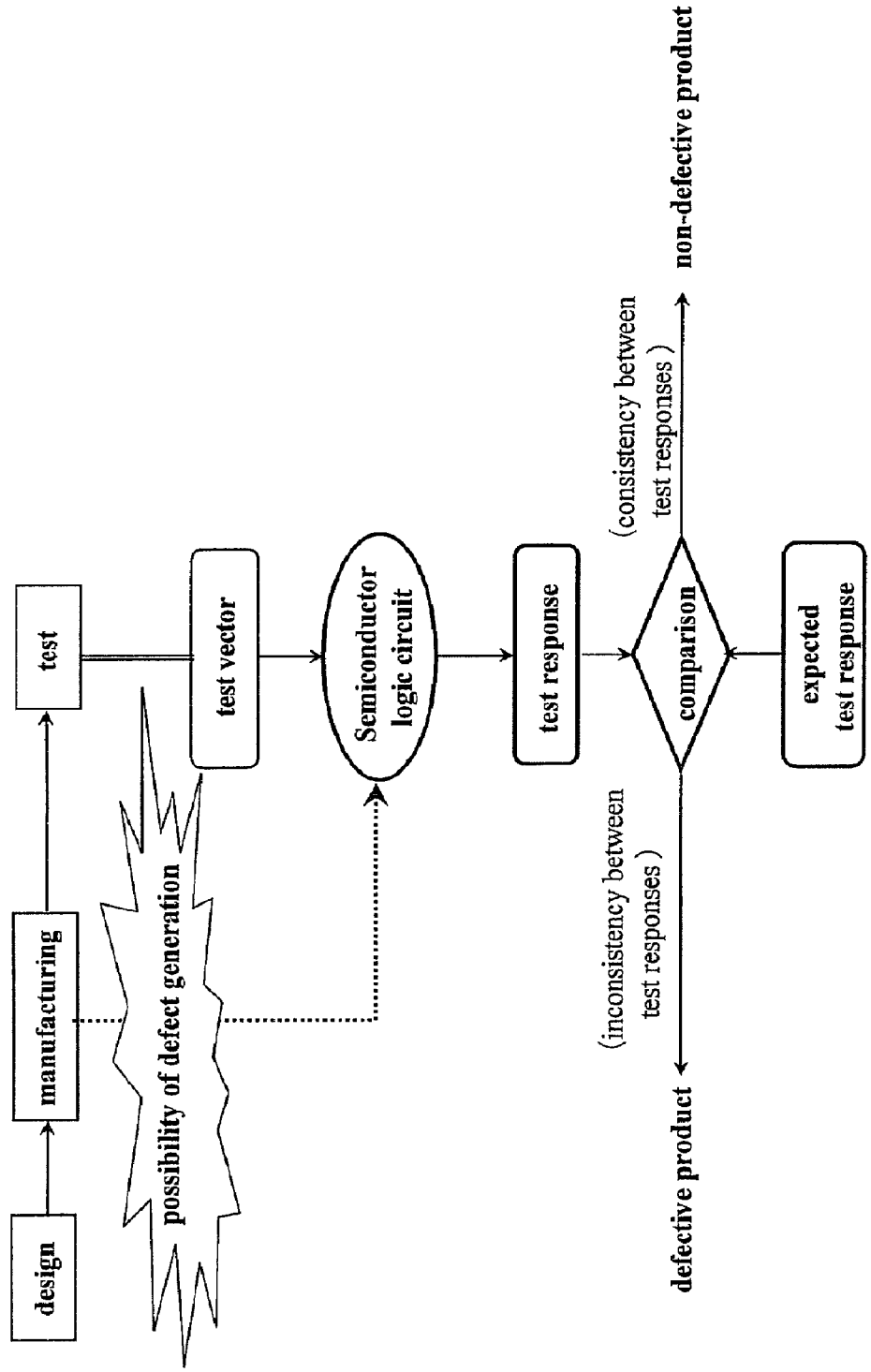
FIG. 16 is a schematic drawing illustrating steps before a semiconductor logic circuit is shipped to the market.
Figure 17:
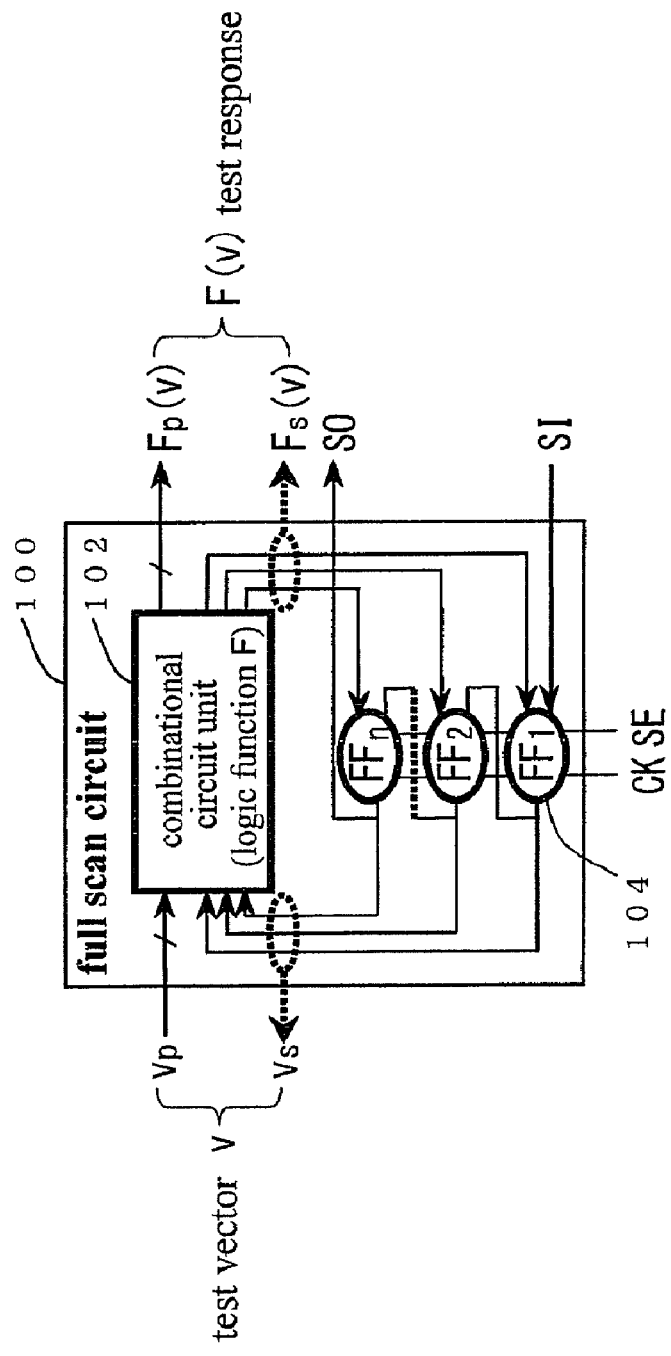
FIG. 17 is a schematic drawing of a conventional full scan sequential circuit in a logic circuit.

In the description so far, the full scan sequential circuit shown in FIG. 1 was used, however, a partial scan circuit shown in FIG. 15 can also be applied. In the partial scan circuit, a part of the flip-flops is replaced with the scan flip-flops, and they are used to form one or a plurality of scan chains.

More specifically, the partial scan circuit comprises a combinational circuit unit 3000, a flip-flop 3001 as a sequential circuit, a scan flip-flop 3002 as a partial scan sequential circuit. The combinational circuit unit 3000 is similar to the combinational circuit unit 300 shown in FIG. 1. However, a part set in the scan flip-flop 3002 <v:PPIn2> and a part where set in the flip-flop 3001 <v:PPIn1> by the scan shift constitute an input <v:PPI> of the combinational circuit unit 3000. An output from the combinational circuit unit 3000 is similar to that of the combinational circuit unit 300 shown in FIG. 1. However, out of a part directly appearing on an external output wire as the test response f (v) with respect to the test vector v, <f (v): PO>, and a part appearing on a pseudo external output wire, <f(v): PPO>, a part fetched into the scan flip-flop 3002 <f (v): PPOn2> and a part fetched into the flip-flop 3001 <f (v): PPOn1> by the scan capture constitute <f (v):PPO>.

FIG. 15b) shows an example where the logic value difference is generated before and after the scan capture in the scan flip-flop 3002 shown in FIG. 15a).

In a manner similar to the description of FIG. 1b), when a bit a which is an element of the test vector <v:PPIn2> and the test response <f (v):PPOn2> corresponding thereto respectively take the different logic values in the scan flip-flop 3002 in FIG. 15b), the logic value difference (hereinafter, referred to as transition) is generated in the capture mode. The number of the transitions with respect to one test vector deeply relates to the power consumption generated in the entire circuit including the combinational circuit unit 3000 resulting from the relevant test vector. Therefore, when the number of the transitions at the time of the capture with respect to the test vector is reduced, the capture power consumption can be reduced.

The invention claimed is:

1. A conversion method for converting a test vector set with respect to a scan circuit, comprising:
   setting one or more candidate bits which can be a don't care bit and one or more fixed bits which cannot be a don't care bit to identify a don't care bit identifiable as don't care from only the candidate bits of the test vector set, the don't care bit being a logic bit which can be either a logic value 0 or a logic value 1 for achieving a predetermined object; and
   deciding a logic value for a don't care bit in a test cube to reduce differences in logic values before and after a scan capture when outputting scan cells included in the scan circuit;
   wherein setting the candidate bits and fixed bits includes:
   discriminating a bit in which a logic value difference is generated before and after scan capture and a bit in which the logic value difference is not generated before and after scan capture from each other in outputs of scan cells included in the scan circuit in relation to each test vector of the test vector set;
   setting the bit in which the logic value difference is not generated as the fixed bit; and
   identifying the candidate bit satisfying predetermined conditions among the bits in which the logic value difference is generated and setting the remaining bits in which the logic value difference is generated failing to be identified as the candidate bit as the fixed bit, and
   wherein the don't care bit is identified from the candidate bits, while the don't care bit is not identified from the fixed bits.

2. The conversion method as claimed in claim 1, wherein identifying the candidate bit satisfying the predetermined conditions recited in claim 1 includes:
   deciding a scheduled total number of the candidate bits in the each test vector;
   allocating the don't care bit to all of the bits in which the logic value difference is generated, and performing three-valued logic simulation and identifying a don't care bit pair of type 1 in which the don't care bit is present in the input bit and is not present in the output bit corresponding thereto and a don't care bit pair of type 2 in which the don't care bit is present in both of in the input bit and the output bit corresponding thereto depending on a result of the three-valued logic simulation; and preferentially selecting the identified don't care bit pair of the type 1 as the candidate bit and, in the case where number of the don't care bits of the type 1 is zero and number of the candidate bits already selected fails to reach the scheduled total number, selecting the don't care bit of the type 2 as the candidate bit based on predetermined criteria.

3. The conversion method as claimed in claim 1, wherein the logic value for the don't care bit is decided according to a dependency relationship between the plurality of bit pairs comprising the don't care bit, the bit pair consisting of an input bit and an output bit, the relationship being whether values of each of the plurality of bit pairs are consistent or inconsistent, or whether consistency of the values of each of the plurality of bit pairs are undecided.

4. A conversion method for converting a test vector set with respect to a scan circuit, comprising:
setting one or more candidate bits which can be a don't care bit and one or more fixed bits which cannot be a don't care bit according to predetermined constraint conditions based on an input-output relationship in the scan circuit to identify a don't care bit identifiable as don't care from only the candidate bits of the test vector set, the don't care bit being a logic bit which can be either a logic value 0 or a logic value 1 for achieving a predetermined object; and
deciding a logic value for a don't care bit in a test cube to reduce differences in logic values before and after a scan capture when outputting scan cells included in the scan circuit;
wherein deciding the logic value for the don't care bit includes:
assuming that the don't care bits corresponding to the outputs of the scan cells included in the scan circuit are different from each other in the test cube and checking a dependency relationship of these don't care bits and inversions thereof in inputs of the scan cells included in the scan circuit in the test cube, and
deciding such a logic value that can minimize the number of the different logic values before and after the scan capture for the don't care bit based on the don't care bits corresponding to the outputs of the scan cells included in the scan circuit and the dependency relationship of the don't care bits and the inversions thereof in the inputs of the scan cells included in the scan circuit.

5. The conversion method as claimed in claim 4, wherein the logic value for the don't care bit is decided according to a dependency relationship between the plurality of bit pairs comprising the don't care bit, the bit pair consisting of an input bit and an output bit, the relationship being whether values of each of the plurality of bit pairs are consistent or inconsistent, or whether consistency of the values of each of the plurality of bit pairs are undecided.

6. A conversion device for converting a test vector set with respect to a scan circuit, comprising:
a setting unit that sets one or more candidate bits which can be a don't care bit and one or more fixed bits which cannot be a don't care bit to identify a don't care bit identifiable as don't care from only the candidate bits of the test vector set, the don't care bit being a logic bit which can be either a logic value 0 or a logic value 1 for achieving a predetermined object; and
a deciding unit that decides a logic value for a don't care bit in a test cube to reduce differences in logic values before and after a scan capture when outputting scan cells included in the scan circuit;
wherein the setting unit comprises:

a discriminating unit that discriminates a bit in which a logic value difference is generated before and after scan capture and a bit in which the logic value difference is not generated before and after scan capture from each other in outputs of scan cells included in the scan circuit in relation to each test vector of the test vector set;
a first identifying unit that identifies a candidate bit satisfying predetermined conditions among the bits in which the logic value difference is generated; and
a second identifying unit that identifies a bit in which the logic value difference is generated but does not satisfy the predetermined conditions as the fixed bit and identifying a bit in which the logic value difference is not generated as the fixed bit, and
wherein the device identifies the don't care bit from the candidate bits, while the device does not identify a don't care bit from the fixed bits.

7. The conversion device as claimed in claim 6, wherein the logic value for the don't care bit is decided according to a dependency relationship between the plurality of bit pairs comprising the don't care bit, the bit pair consisting of an input bit and an output bit, the relationship being whether values of each of the plurality of bit pairs are consistent or inconsistent, or whether consistency of the values of each of the plurality of bit pairs are undecided.

8. The conversion device as claimed in claim 6, wherein the setting unit decides a scheduled total number of the candidate bits in the each test vector; allocates the don't care bit to all of the bits in which the logic value difference is generated, and performs three-valued logic simulation and identifies a don't care bit pair of type 1 in which the don't care bit is present in the input bit and is not present in the output bit corresponding thereto and a don't care bit pair of type 2 in which the don't care bit is present in both of in the input bit and the output bit corresponding thereto depending on a result of the three-valued logic simulation; and preferentially selects the identified don't care bit pair of the type 1 as the candidate bit and, in the case where number of the don't care bits of the type 1 is zero and number of the candidate bits already selected fails to reach the scheduled total number, selects the don't care bit of the type 2 as the candidate bit based on predetermined criteria.

9. A conversion device for converting a test vector set with respect to a scan circuit, comprising:
a setting unit that sets one or more candidate bits which can be a don't care bit and one or more fixed bits which cannot be a don't care bit according to predetermined constraint conditions based on an input-output relationship in the scan circuit to identify a don't care bit identifiable as don't care from only the candidate bits of the test vector set, the don't care bit being a logic bit which can be either a logic value 0 or a logic value 1 for achieving a predetermined object; and
a deciding unit that decides a logic value for a don't care bit in a test cube to reduce differences in logic values before and after a scan capture when outputting scan cells included in the scan circuit,
wherein the deciding unit assumes that the don't care bits corresponding to the outputs of the scan cells included in the scan circuit are different from each other in the test cube and checks a dependency relationship of these don't care bits and inversions thereof in inputs of the scan cells included in the scan circuit in the test cube, and decides such a logic value that can minimize the number of the different logic values before and after the scan capture for the don't care bit based on the don't care bits corresponding to the outputs of the scan cells included in the scan circuit and the dependency relationship of the don't care bits and the inversions thereof in the inputs of the scan cells included in the scan circuit.

10. The conversion device as claimed in claim 9, wherein the logic value for the don't care bit is decided according to a dependency relationship between the plurality of bit pairs comprising the don't care bit, the bit pair consisting of an input bit and an output bit, the relationship being whether values of each of the plurality of bit pairs are consistent or inconsistent, or whether consistency of the values of each of the plurality of bit pairs are undecided.

11. A non-transitory computer-readable medium comprising a program which, when executed, performs action comprising:
   setting one or more candidate bits which can be a don't care bit and one or more fixed bits which cannot be a don't care bit to identify a don't care bit identifiable as don't care from only the candidate bits of the test vector set, the don't care bit being a logic bit which can be either a logic value 0 or a logic value 1 for achieving a predetermined object; and
   deciding a logic value for a don't care bit in a test cube to reduce differences in logic values before and after a scan capture when outputting scan cells included in the scan circuit;
   wherein setting the candidate bits and the fixed bits comprises:
   discriminating a bit in which a logic value difference is generated before and after scan capture and a bit in which the logic value difference is not generated before and after scan capture from each other in outputs of scan cells included in the scan circuit in relation to each test vector of the test vector set;
   setting the bit in which the logic value difference is not generated as the fixed bit; and
   identifying the candidate bit satisfying predetermined conditions among the bits in which the logic value difference is generated and setting the remaining bits in which the logic value difference is generated failing to be identified as the candidate bit as the fixed bit, and
   wherein the don't care bit is identified from the candidate bits, while the don't care bit is not identified from the fixed bits.

12. The non-transitory computer-readable medium as claimed in claim 11, wherein the logic value for the don't care bit is decided according to a dependency relationship between the plurality of bit pairs comprising the don't care bit, the bit pair consisting of an input bit and an output bit, the relationship being whether values of each of the plurality of bit pairs are consistent or inconsistent, or whether consistency of the values of each of the plurality of bit pairs are undecided.

13. The non-transitory computer-readable medium as claimed in claim 11, wherein identifying the candidate bit satisfying the predetermined conditions comprises:
   deciding a scheduled total number of the candidate bits in the each test vector;
   allocating the don't care bit to all of the bits in which the logic value difference is generated, and performing three-valued logic simulation and identifying a don't care bit pair of type 1 in which the don't care bit is present in the input bit and is not present in the output bit corresponding thereto and a don't care bit pair of type 2 in which the don't care bit is present in both of in the input bit and the output bit corresponding thereto depending on a result of the three-valued logic simulation; and
   preferentially selecting the identified don't care bit pair of the type 1 as the candidate bit and, in the case where number of the don't care bits of the type 1 is zero and number of the candidate bits already selected fails to reach the scheduled total number, selecting the don't care bit of the type 2 as the candidate bit based on predetermined criteria.

14. A non-transitory computer-readable storage medium comprising a program which, when executed, performs action comprising:
   setting one or more candidate bits which can be a don't care bit and one or more fixed bits which cannot be a don't care bit according to predetermined constraint conditions based on an input-output relationship in the scan circuit to identify a don't care bit identifiable as don't care from only the candidate bits of the test vector set, the don't care bit being a logic bit which can be either a logic value 0 or a logic value 1 for achieving a predetermined object; and
   deciding a logic value for a don't care bit in a test cube to reduce differences in logic values before and after a scan capture when outputting scan cells included in the scan circuit;
   wherein deciding the logic value for the don't care bit comprises:
   assuming that the don't care bits corresponding to the outputs of the scan cells included in the scan circuit are different from each other in the test cube and checking a dependency relationship of these don't care bits and inversions thereof in inputs of the scan cells included in the scan circuit in the test cube, and
   deciding such a logic value that can minimize the number of the different logic values before and after the scan capture for the don't care bit based on the don't care bits corresponding to the outputs of the scan cells included in the scan circuit and the dependency relationship of the don't care bits and the inversions thereof in the inputs of the scan cells included in the scan circuit.

15. The non-transitory computer-readable medium as claimed in claim 14, wherein the logic value for the don't care bit is decided according to a dependency relationship between the plurality of bit pairs comprising the don't care bit, the bit pair consisting of an input bit and an output bit, the relationship being whether values of each of the plurality of bit pairs are consistent or inconsistent, or whether consistency of the values of each of the plurality of bit pairs are undecided.

* * * * *